United States Patent
Shinozaki

(10) Patent No.: US 7,961,500 B2
(45) Date of Patent: Jun. 14, 2011

(54) SEMICONDUCTOR DEVICE

(75) Inventor: Masao Shinozaki, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 58 days.

(21) Appl. No.: 12/432,796

(22) Filed: Apr. 30, 2009

(65) Prior Publication Data
US 2009/0323400 A1    Dec. 31, 2009

(30) Foreign Application Priority Data

Jun. 27, 2008 (JP) .................... 2008-168093

(51) Int. Cl.
G11C 11/00 (2006.01)
(52) U.S. Cl. .... 365/154; 365/211; 365/228; 365/189.11
(58) Field of Classification Search .................. 365/154, 365/211, 228, 189.11
See application file for complete search history.

(56) References Cited

U.S. PATENT DOCUMENTS

| | | | | |
|---|---|---|---|---|
| 4,020,358 A * | 4/1977 | Wyland | | 307/39 |
| 4,792,766 A * | 12/1988 | Wieschhoff et al. | | 330/298 |
| 5,784,328 A * | 7/1998 | Irrinki et al. | | 365/222 |
| 6,128,239 A * | 10/2000 | Perner | | 365/209 |
| 6,446,019 B1 * | 9/2002 | Kynett et al. | | 702/104 |
| 6,476,716 B1 * | 11/2002 | Ledlow | | 340/501 |
| 6,577,549 B1 * | 6/2003 | Tran et al. | | 365/211 |
| 6,608,790 B2 * | 8/2003 | Tran et al. | | 365/211 |
| 6,662,136 B2 * | 12/2003 | Lamb et al. | | 702/132 |
| 6,735,546 B2 * | 5/2004 | Scheuerlein | | 702/132 |
| 6,824,307 B2 * | 11/2004 | Vail et al. | | 374/183 |
| 7,079,438 B2 * | 7/2006 | Perner et al. | | 365/211 |
| 7,113,424 B2 * | 9/2006 | Happ et al. | | 365/163 |
| 7,277,343 B1 * | 10/2007 | So et al. | | 365/211 |
| 7,580,303 B2 * | 8/2009 | Nishimura et al. | | 365/203 |
| 7,633,264 B2 * | 12/2009 | Fukuzawa et al. | | 320/116 |
| 7,755,965 B2 * | 7/2010 | Chen et al. | | 365/211 |
| 7,768,811 B2 * | 8/2010 | Matsuno et al. | | 365/145 |
| 2005/0068832 A1 | 3/2005 | Andoh | | |

FOREIGN PATENT DOCUMENTS

JP    6-314491 A    11/1994
JP    2005-108307 A    4/2005

OTHER PUBLICATIONS

S. Ohbayashi et al.; A 65 nm SoC Embedded 6T-SRAM Design for Manufacturing with Read and Write Cell Stabilizing Circuits; 2006 Symposium on VLSI Circuits Digest of Technical Papers, Jun. 15-17, 2006.

* cited by examiner

*Primary Examiner* — Viet Q Nguyen
(74) *Attorney, Agent, or Firm* — Mattingly & Malur, P.C.

(57) ABSTRACT

There is provided a technique for ensuring both an SNM and a write margin simultaneously in a semiconductor device having static memory cells. A semiconductor device has a plurality of static memory cells. The semiconductor device includes a memory cell array having the static memory cells arranged in a matrix, a temperature sensor circuit for sensing a temperature in the semiconductor device, and a word driver for controlling a voltage supplied to a word line of the memory cell array based on an output of the temperature sensor circuit at the time of writing to or reading from a memory cell.

7 Claims, 20 Drawing Sheets

US 7,961,500 B2

SEMICONDUCTOR DEVICE

CROSS-REFERENCE TO RELATED APPLICATIONS

The disclosure of Japanese Patent Application No. 2008-168093 filed on Jun. 27, 2008 including the specification, drawings and abstract is incorporated herein by reference in its entirety.

BACKGROUND OF THE INVENTION

The present invention relates to a semiconductor device, and in particular, relates to a semiconductor device having static memory cells.

The present inventors have investigated the following techniques related to a semiconductor device having static memory cells.

In an SRAM (Static Random Access Memory) having a plurality of static memory cells arranged in a matrix, the selection terminals of the memory cells in the respective rows are coupled to the respective word lines, and the data input/output terminals of the memory cells in the respective columns are coupled to the respective complementary data lines (also referred to as complementary bit lines). The complementary data lines are common-coupled to a complementary common data line through a Y selection switch circuit including a plurality of column selection switches one-to-one coupled to the complementary data lines. In such an SRAM, a power supply voltage supplied to a memory cell array is maintained constant.

For example, Patent Documents 1 and 2 and Non-patent Document 1 describe techniques related to such a semiconductor device.

[Patent Document 1] Japanese Unexamined Patent Publication No. 2005-108307

[Patent Document 2] Japanese Unexamined Patent Publication No. Hei 6(1994)-314491

[Non-patent Document 1] "A 65 nm SoC Embedded 6T-SRAM Design for Manufacturing with Read and Write Stabilizing Circuits" written by S. Obayashi et al., 2006 Symposium on VLSI Circuits Digest of Technical Papers

SUMMARY OF THE INVENTION

The present inventors have investigated the techniques related to the semiconductor device and found the following.

Finer structure of the device increases local fluctuations in threshold voltages Vth of transistors configuring an SRAM memory cell, which makes it difficult to ensure compatibility between the SNM (Static Noise Margin) and write margin of the SRAM in a Vth management width. The SNM refers to a margin that enables data stored in the memory cell not to be inverted for retention at the time of reading the data from the memory cell. The write margin refers to a margin that enables data stored in the memory cell to be inverted for writing at the time of writing data to the memory cell.

FIG. 23 shows the relationship between an SNM and a write margin. In FIG. 23, the vertical axis indicates the yield, and the horizontal axis indicates the threshold voltage Vth of transistors of an SRAM memory cell. As shown in FIG. 23, there is a trade-off relationship between the SNM and the write margin. That is, the threshold voltage becomes lower at higher temperatures, thus degrading the SNM, and the threshold voltage becomes higher at lower temperatures, thus degrading the write margin.

Non-patent Document 1 introduces a technique in which a high (High) level voltage $V_{WL}$ on a word line is made lower than a power supply voltage VDD by an n-type MOS transistor that is coupled to the word line and is always on, thereby improving the SNM. FIG. 24 shows the waveform of the high level voltage $V_{WL}$ on the word line WL. As shown in FIG. 24, the high level voltage $V_{WL}$ on the word line WL is $\Delta V$ lower than the power supply voltage VDD.

However, if the word line voltage is lower than the power supply voltage, the write margin becomes degraded, which makes it impossible to sufficiently extend an operation margin for the threshold voltage (Vth) of transistors. FIG. 25 shows the relationship between the SNM and the write margin in the case where the high level voltage $V_{WL}$ on the word line WL is $\Delta V$ lower than the power supply voltage VDD. In FIG. 25, the vertical axis indicates the yield, and the horizontal axis indicates the threshold voltage (Vth) of transistors of an SRAM memory cell. The solid line indicates the case where the high level voltage $V_{WL}$ on the word line WL is VDD, and the broken line indicates the case where the high level voltage $V_{WL}$ on the word line WL is VDD-$\Delta V$. As shown in FIG. 25, if the high level voltage $V_{WL}$ on the word line WL is VDD-$\Delta V$, the SNM is improved (the yield is increased), whereas the write margin is degraded (the yield is decreased).

In Non-patent Document 1, this problem is solved by decreasing the VDD potential (ARVDD) of the memory cell during a write (Write) cycle.

However, a large decrease in the VDD potential of the memory cell may degrade the retention margin of deactivated cells on the same column. Further, since it is necessary to perform an operation in which ARVDD is decreased to a potential for ensuring the write margin and then increased to VDD in the write cycle, there occurs a problem that a cycle frequency becomes degraded. For this reason, there is a limit in ensuring both the SNM and the write margin simultaneously.

Accordingly, it is an object of the present invention to provide a technique for ensuring both the SNM and the write margin simultaneously in a semiconductor device having static memory cells.

The above and other objects and novel features of the present invention will be apparent from the description of this specification and the accompanying drawings.

Based on the invention result, the present inventors have conducted a prior art search in terms of "an SRAM that controls the output voltage of a word line driver by means of the output of a temperature sensor in order to ensure the SNM and the write margin simultaneously", and found Patent Documents 1 and 2 as a result.

Patent Document 1 describes an SRAM in which, in a low-temperature range not higher than a sensed temperature T0 at which the output voltage of a temperature sensor circuit becomes equal to the output voltage of a reference voltage generating circuit, a variable voltage generating circuit generates a reference voltage Vref by decreasing an external power supply voltage Vdd by an arbitrary voltage $\Delta V$, and the decreased voltage (Vdd-$\Delta V$) is supplied as a variable power supply voltage Vcp through word line drivers to the word lines WL of memory cells. Patent Document 1 is intended for stabilization during data retention (deactivation) by increasing voltages on non-selected word lines when a temperature rises during data retention.

Patent Document 2 describes an SRAM for extending an operating range by controlling a memory cell voltage based on the result sensed by a temperature sensor. Patent Document 2 is intended to stabilize data retention at low temperatures, and no investigation has been made on active operations.

A representative aspect of the invention will be briefly described below.

A semiconductor device according to a representative aspect has a plurality of static memory cells. The semiconductor device includes a memory cell array having the static memory cells arranged in a matrix, a temperature sensor circuit for sensing a temperature in the semiconductor device, and a voltage control circuit for controlling a voltage supplied to the memory cell array based on an output of the temperature sensor circuit at the time of writing to or reading from a memory cell.

According to the representative aspect, it is possible to ensure the yield over a wide range of threshold voltages Vth.

DESCRIPTION OF THE PREFERRED EMBODIMENTS

Figure 1:
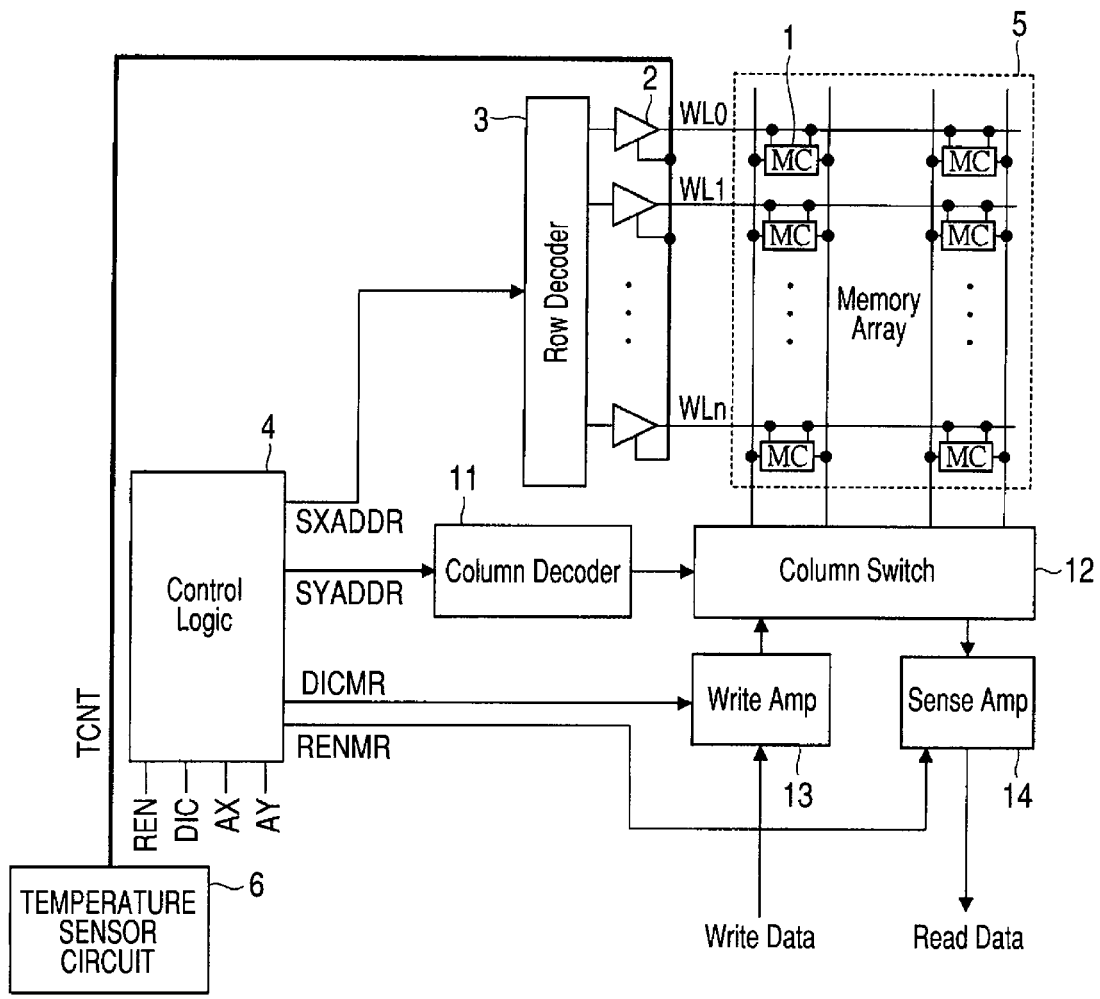
FIG. 1 is a block diagram showing a configuration example of an SRAM module in a semiconductor device according to a first embodiment of the present invention.

Hereinafter, preferred embodiments of the present invention will be described in detail with reference to the accompanying drawings. In all the drawings for illustrating the embodiments, the same components are basically denoted by the same reference numerals, and their description will not be repeated. Further, unless otherwise specified, symbols representing terminal names also indicate their line names and signal names, and symbols representing power supplies also indicate their voltage values.

In the following embodiments, description will be made by dividing an embodiment into a plurality of sections or embodiments when necessary for the sake of convenience. Except for the case where a clear indication is specially given, they are not mutually unrelated, but there is a relationship that one section or embodiment is a modification, specification, or supplementary explanation of part or all of another section or embodiment. Further, in the case where the following embodiments deal with a numerical expression (including a number, a numerical value, amount, range) concerning elements, the numerical expression is not limited to the specific number but may be larger or smaller than the specific number, except for the case where a specific indication is given and the case where the expression is apparently limited to a specific number in principle.

First Embodiment

FIG. 1 is a block diagram showing a configuration example of an SRAM module in a semiconductor device according to the first embodiment of the invention.

First, one example of the configuration of the SRAM module in the semiconductor device according to the first embodiment will be described with reference to FIG. 1. The semiconductor device according to the first embodiment is formed over a single semiconductor substrate such as a silicon substrate, using a known semiconductor integrated circuit manufacturing technology, but is not limited thereto.

The SRAM module according to the first embodiment includes a memory cell array (Memory Array) 5 having a plurality of static memory cells (MCs) 1 arranged in a matrix, word drivers 2 for driving word lines WL0 to WLn coupled to the selection terminals of the memory cells 1, a row decoder (Row Decoder) 3, a control logic (Control Logic) 4 for controlling the write/read operation of the SRAM module, a column decoder (Column Decoder) 11, a column switch (Column Switch) 12, a write amplifier (Write Amp) 13, a sense amplifier (Sense Amp) 14, and a temperature sensor circuit 6 for sensing a temperature in the semiconductor device.

The selection terminals of the memory cells 1 in the respective rows are coupled to the respective word lines WL0 to WLn, and the data input/output terminals of the memory cells 1 in the respective columns are coupled to the respective complementary bit lines. The complementary bit lines are coupled to the column switch 12.

Address selection signals AX and AY are inputted through the control logic 4 to the row decoder 3 and the column decoder 11 respectively, where they are decoded. An output of the row decoder 3 is inputted to a word driver 2 to activate one of the word lines WL0 to WLn.

An output of the column decoder 11 is inputted to the column switch (Column Switch) 12 to activate one pair of the complementary bit lines in the memory cell array 5, the write amplifier 13, and the sense amplifier 14.

During a read (Read) cycle, a signal REN is activated to a high level, which activates a signal RENMR to the high level through the control logic 4, thereby activating the sense amplifier 14. Data read from a memory cell 1 selected by a word line WL passes through complementary bit lines and the column switch 12, and is amplified by the sense amplifier 14 and outputted as read data (Read Data).

The read cycle includes a period over which the sense amplifier is activated, read data from the memory cell is outputted through the sense amplifier, and the sense amplifier is deactivated.

The read time includes a period for activating the word line coupled to the memory cell from which data is read.

During a write (Write) cycle, a signal DIC is activated to the high level, which activates a signal DICMR to the high level through the control logic 4, thereby activating the write amplifier 13. Write data (Write Data) inputted from the outside is sent to complementary bit lines through the column switch 12 by the write amplifier 13 and written to a memory cell 1 selected by a word line WL. Further, an output signal TCNT of the temperature sensor circuit 6 is inputted to the word drivers 2 for driving the word lines WL.

The write cycle includes a period over which the write amplifier (write driver) is activated, data is written to the memory cell, and the write amplifier is deactivated.

The write time includes a period for activating the word line coupled to the memory cell to which data is written.

Figure 2:
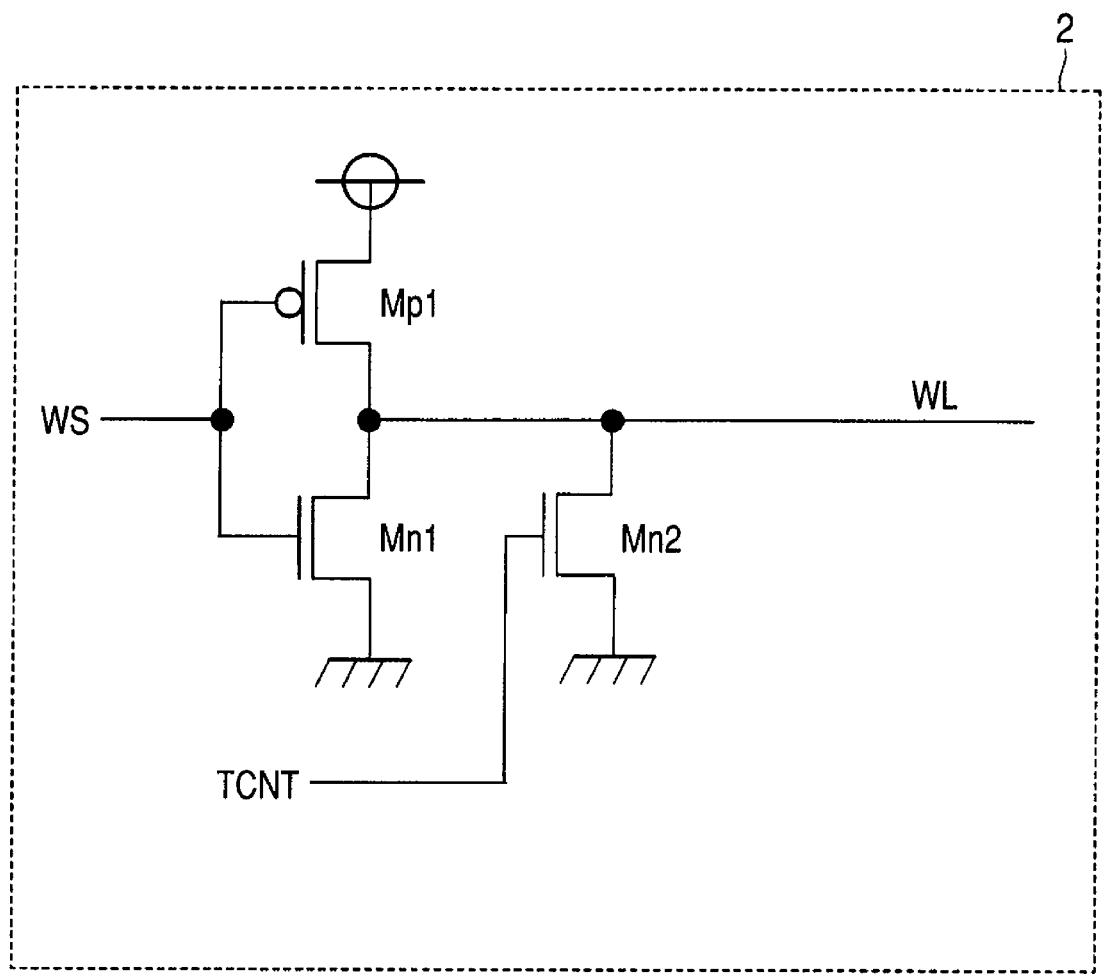
FIG. 2 is a circuit diagram showing a configuration example of a word driver shown in FIG. 1.
Figure 3:
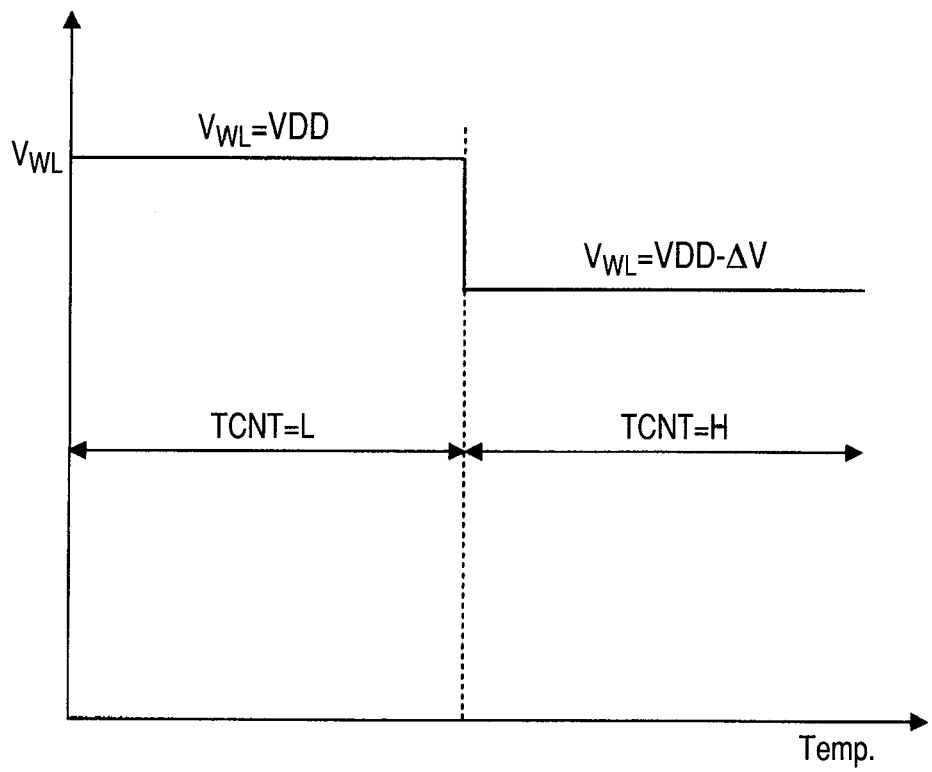
FIG. 3 is a graph showing the temperature characteristic of a high level voltage $V_{WL}$ on a word line WL which is the output of the word driver in the semiconductor device according to the first embodiment of the invention.

FIG. 2 is a circuit diagram showing a configuration example of the word driver 2 shown in FIG. 1. FIG. 3 is a graph showing the temperature characteristic of a high level voltage $V_{WL}$ on the word line WL which is the output of the word driver 2.

When the corresponding word driver 2 is selected by the row decoder 3, a signal WS becomes a low level so that an n-type MOS transistor Mn1 is turned off, and the word line WL is brought to the high level by a p-type MOS transistor Mp1. At this time, when a signal TCNT becomes the high level, the high level on the word line WL becomes a voltage (VDD-ΔV) lower than a power supply voltage VDD, based on current pull by the p-type MOS transistor Mp1 and an n-type MOS transistor Mn2.

The temperature sensor circuit 6 has a characteristic that the signal TCNT becomes the low level (TCNT=L) at low temperatures and becomes the high level (TCNT=H) at high temperatures. Accordingly, as shown in FIG. 3, the high level voltage $V_{WL}$ on the word line WL has a characteristic that $V_{WL}$=VDD at low temperatures and $V_{WL}$=VDD-ΔV at high temperatures.

Figure 4:
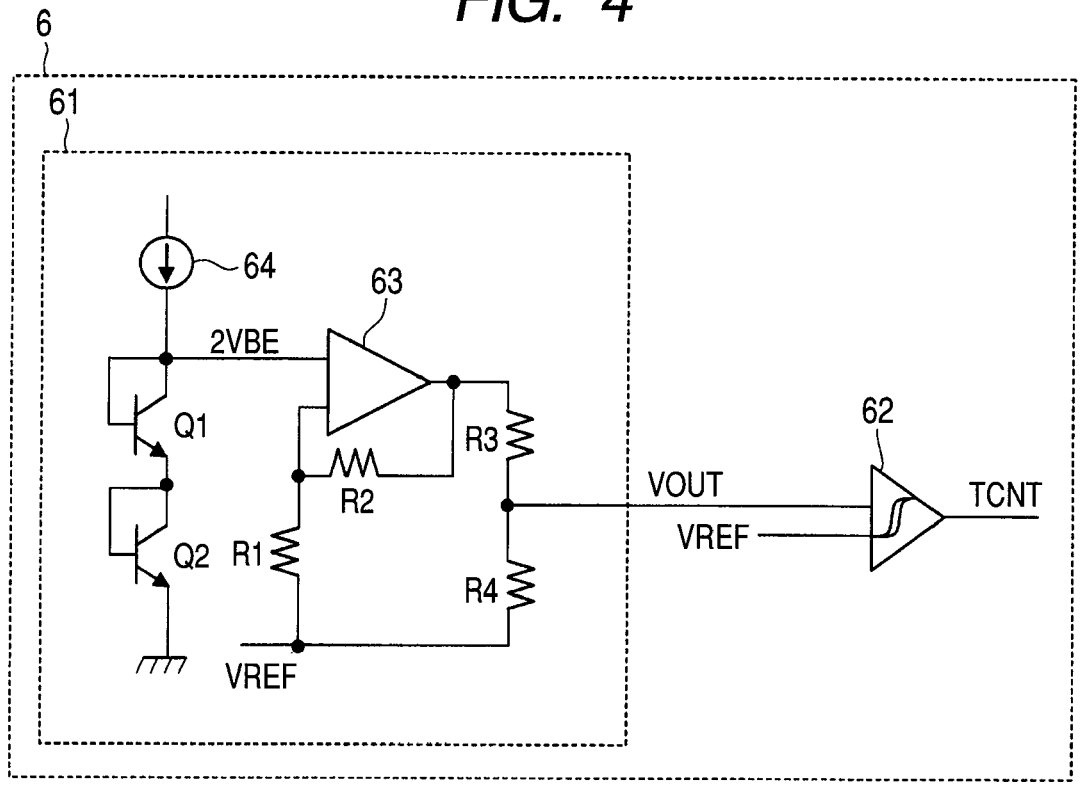
FIG. 4 is a circuit diagram showing a configuration example of a temperature sensor circuit shown in FIG. 1.
Figure 5:
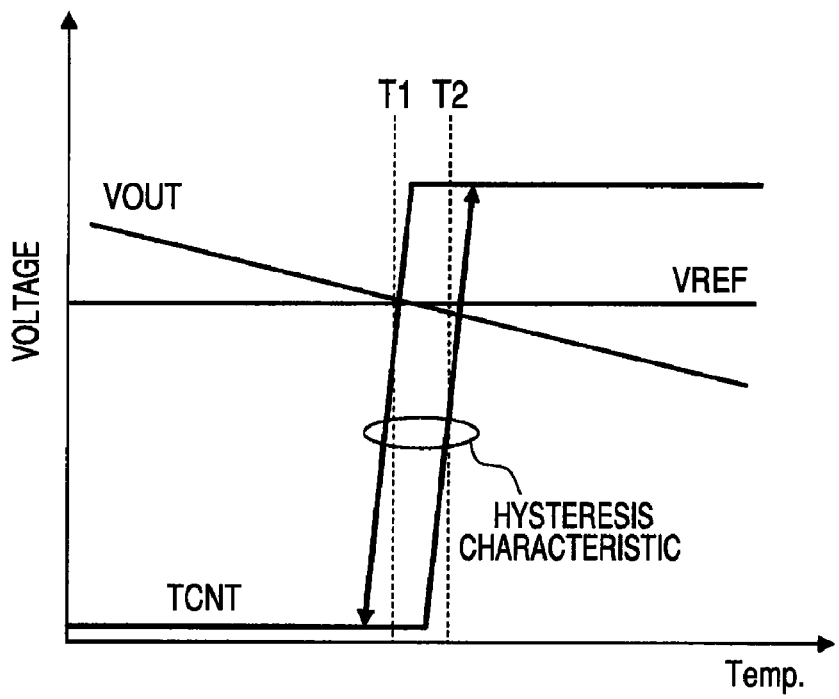
FIG. 5 is a graph showing the temperature characteristic of an output signal TCNT of the temperature sensor circuit in the semiconductor device according to the first embodiment of the invention.

FIG. 4 is a circuit diagram showing an example of the configuration of the temperature sensor circuit 6 shown in FIG. 1. FIG. 5 is a graph showing the temperature characteristic of the output signal TCNT of the temperature sensor circuit 6.

As shown in FIG. 4, the temperature sensor circuit 6 includes a temperature sensor section 61 and a Schmitt trigger circuit 62. The temperature sensor section 61 includes a differential amplifier 63, a current source 64, bipolar transistors Q1 and Q2, and resistors R1 to R4.

Since the differential amplifier 63 amplifies the two VBE voltages of the bipolar transistors Q1 and Q2, the temperature sensor section 61 has such a temperature gradient of an output voltage VOUT that the output voltage VOUT becomes higher at lower temperatures and becomes lower at higher temperatures as shown in FIG. 5. The gradient of the output voltage VOUT and a temperature at which the output voltage VOUT intersects a reference voltage VREF can be adjusted by setting the values of the resistors R1 to R4 appropriately.

Since the output (signal TCNT) of the temperature sensor circuit 6 is distributed to a plurality of memory modules, it is more advantageous to convert the analog output voltage VOUT into a digital signal, in consideration of noise immunity. For this reason, the analog output voltage VOUT is converted into the digital signal TCNT by the Schmitt trigger circuit 62. The Schmitt trigger circuit 62 has such a hysteresis characteristic that the digital signal TCNT changes from the low level (L) to the high level (H) at a threshold temperature T2 at the time of changing from low temperatures to high temperatures and the digital signal TCNT changes from the high level (H) to the low level (L) at a threshold temperature T1 at the time of changing from high temperatures to low temperatures. This prevents the power consumption and noise from increasing due to the frequent changes of the signal TCNT between the high level (H) and the low level (L) at about the temperature of just a determination level.

Figure 6:
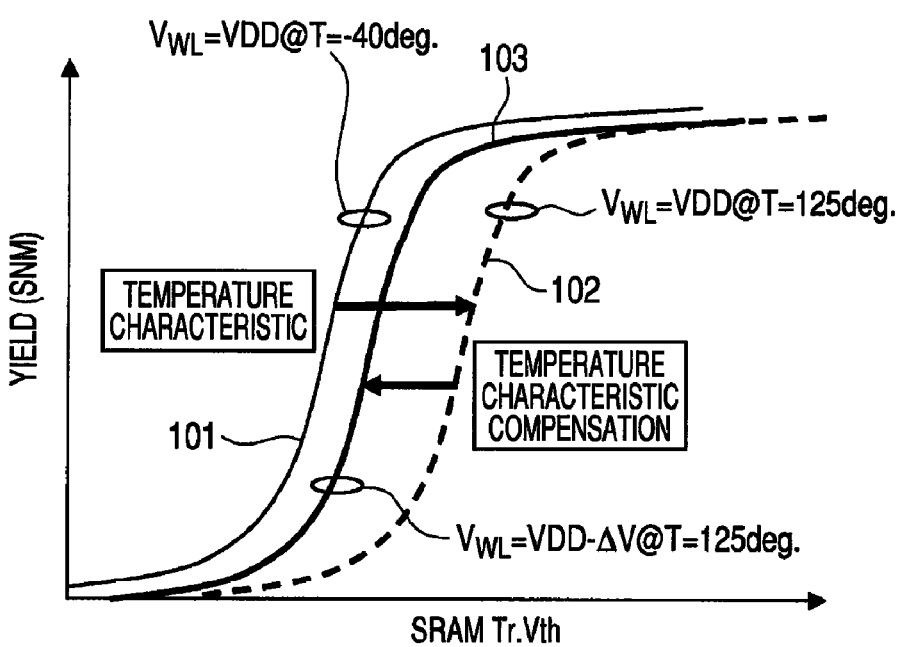
FIG. 6 is a graph showing the SRAM yield due to an SNM versus the threshold voltage Vth of n-type MOS transistors configuring a 6Tr-SRAM in the semiconductor device according to the first embodiment of the invention.
Figure 8:
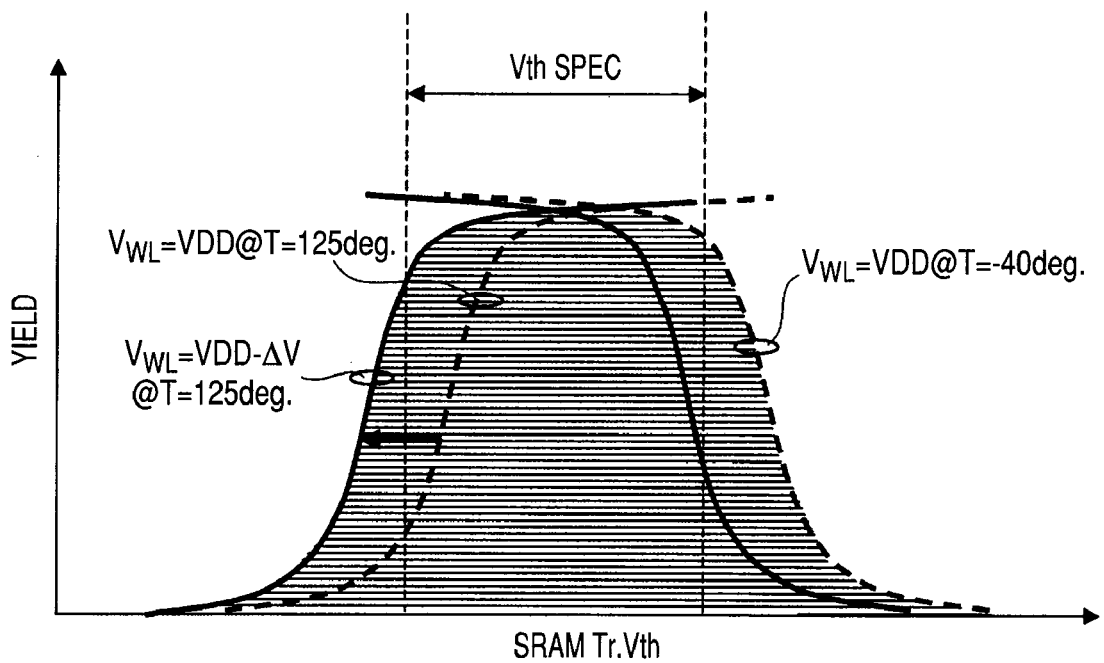
FIG. 8 is a graph showing the SRAM yield versus the threshold voltage Vth of the n-type MOS transistor, with the SNM and the write margin combined, in the semiconductor device according to the first embodiment of the invention.

Since the high level voltage $V_{WL}$ on the word line WL becomes the voltage (VDD-ΔV) at high temperatures, it is possible to compensate the temperature characteristic of an SNM as shown in FIG. 6. Accordingly, it is possible to extend the range of threshold voltages Vth that can ensure the yield as shown in FIG. 8.

FIG. 6 is a graph showing the SRAM yield due to an SNM versus the threshold voltage Vth of n-type MOS transistors (Access-MOS, Driver-MOS) configuring a 6Tr-SRAM in the first embodiment. In FIG. 6, the vertical axis indicates the yield (SNM), and the horizontal axis indicates the threshold voltage Vth of transistors of an SRAM memory cell. Reference numeral 101 denotes the case where the high level voltage $V_{WL}$ on the word line WL is VDD at a temperature of −40 degrees. Reference numeral 102 denotes the case where the high level voltage $V_{WL}$ on the word line WL is VDD at a temperature of 125 degrees. Reference numeral 103 denotes the case where the high level voltage $V_{WL}$ on the word line WL is VDD-ΔV at a temperature of 125 degrees.

As the threshold voltage Vth of the n-type MOS transistor of the memory cell increases, the static noise margin (SNM) increases so that the yield increases. Similarly, as the temperature increases, the static noise margin (SNM) decreases so that the yield decreases (the change from 101 to 102). In the first embodiment, the high level voltage $V_{WL}$ on the word line WL is decreased from VDD to VDD-ΔV at high temperatures by the output (signal TCNT) of the temperature sensor circuit 6 (the change from 102 to 103). Since the static noise margin (SNM) increases as the voltage $V_{WL}$ decreases, it is possible to compensate the SNM deterioration caused by the temperature characteristic.

Figure 7:
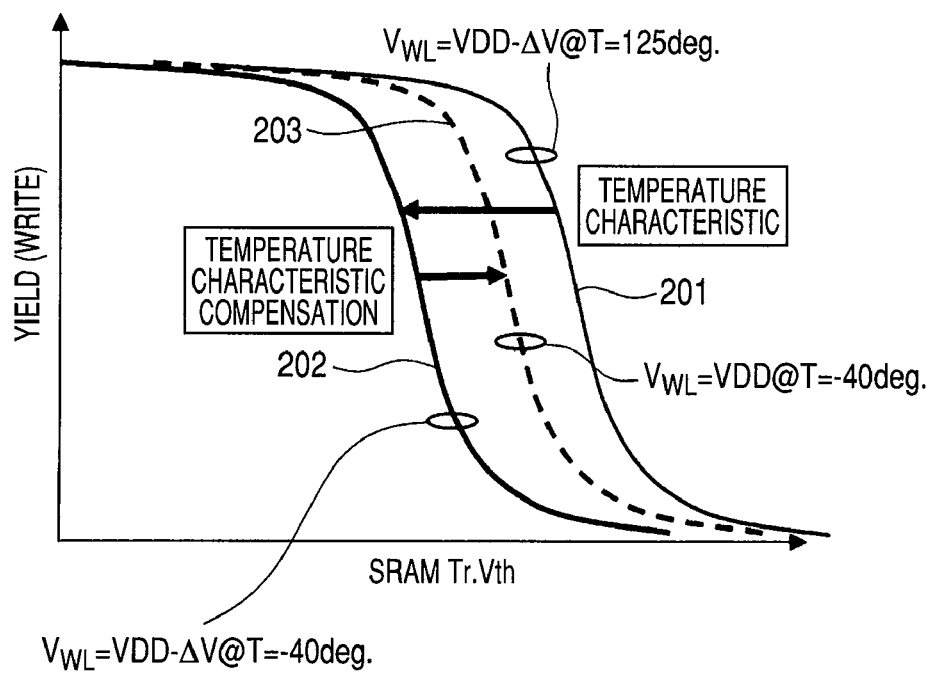
FIG. 7 is a graph showing the SRAM yield due to a write margin versus the threshold voltage Vth of n-type MOS transistors configuring a 6Tr-SRAM in the semiconductor device according to the first embodiment of the invention.

FIG. 7 is a graph showing the SRAM yield due to a write margin versus the threshold voltage Vth of n-type MOS transistors configuring a 6Tr-SRAM in the first embodiment. In FIG. 7, the vertical axis indicates the yield (write margin), and the horizontal axis indicates the threshold voltage Vth of transistors of an SRAM memory cell. Reference numeral 201 denotes the case where the high level voltage $V_{WL}$ on the word line WL is VDD-ΔV at a temperature of 125 degrees. Reference numeral 202 denotes the case where the high level voltage $V_{WL}$ on the word line WL is VDD-ΔV at a temperature of −40 degrees. Reference numeral 203 denotes the case where the high level voltage $V_{WL}$ on the word line WL is VDD at a temperature of −40 degrees.

The write margin has a characteristic contrary to that of the SNM. That is, as the threshold voltage Vth of the n-type MOS transistor decreases, the write margin increases so that the yield increases. Similarly, as the temperature decreases, the write margin decreases so that the yield decreases (the change from 201 to 202). Since the high level voltage $V_{WL}$ on the word line WL is increased from VDD-ΔV to VDD at low temperatures by the output (signal TCNT) of the temperature sensor circuit 6 (the change from 202 to 203), it is possible to compensate the write margin deterioration due to the temperature characteristic.

FIG. 8 is a graph showing the SRAM yield versus the threshold voltage Vth of the n-type MOS transistor, with the SNM and the write margin combined. Since the voltage $V_{WL}$ is automatically adjusted from VDD to VDD-ΔV at high temperatures by the temperature sensor circuit, it is possible to extend the Vth range that can ensure the yield.

Second Embodiment

Figure 9:
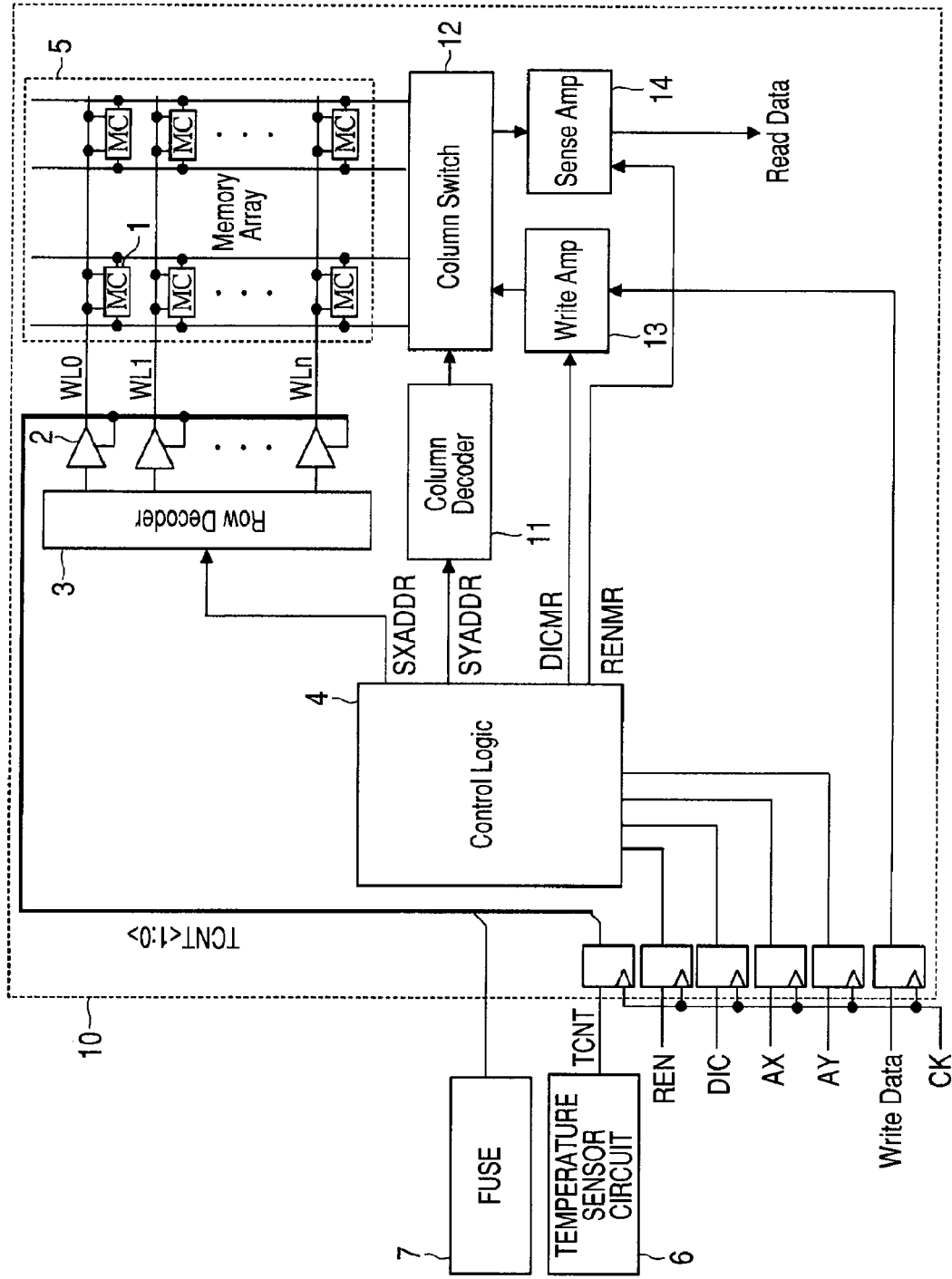
FIG. 9 is a block diagram showing a configuration example of an SRAM module in a semiconductor device according to a second embodiment of the invention.
Figure 10:
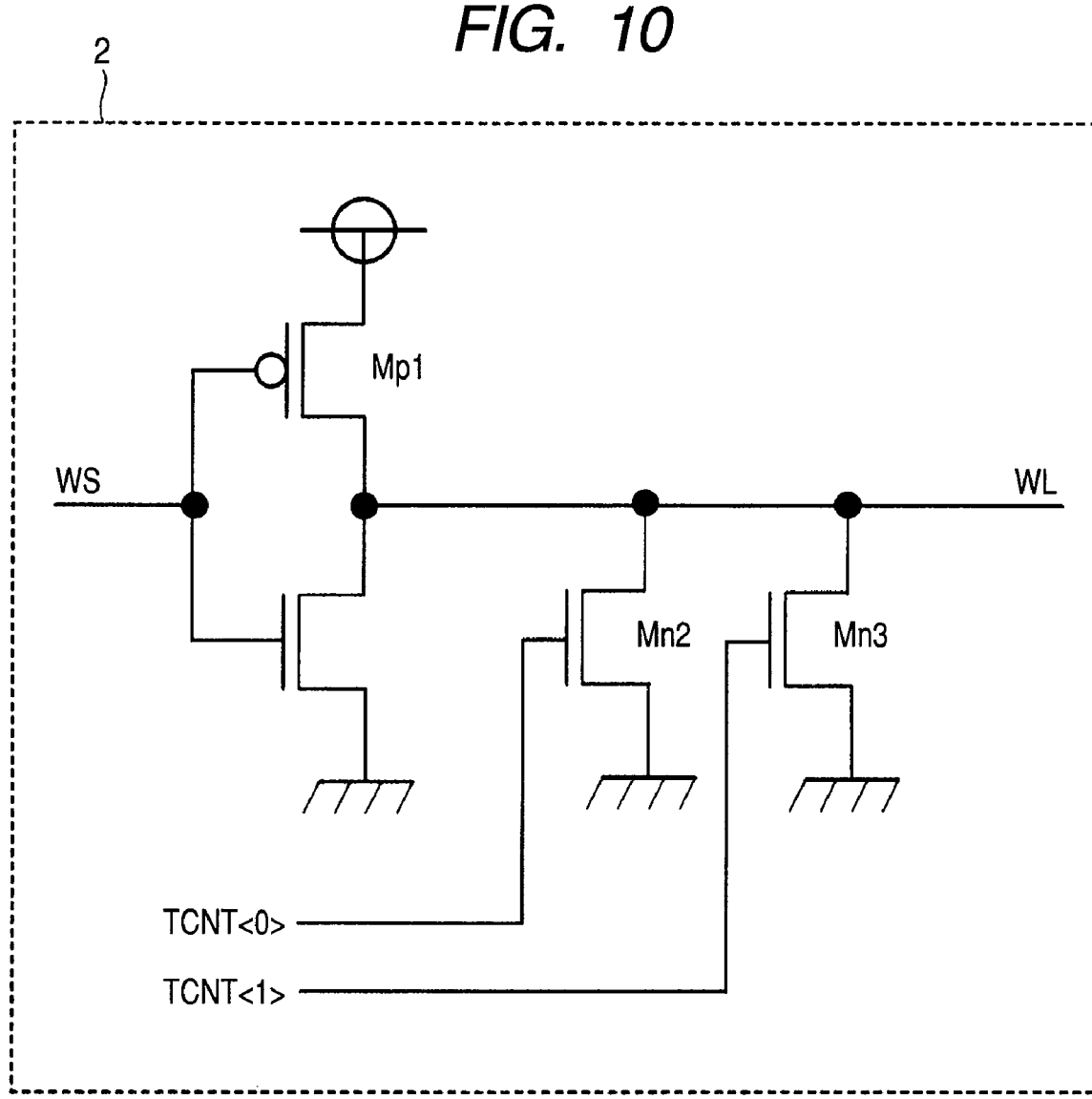
FIG. 10 is a circuit diagram showing a configuration example of the word driver shown in FIG. 9.

FIG. 9 is a block diagram showing a configuration example of an SRAM module in a semiconductor device according to the second embodiment of the invention. FIG. 10 is a circuit diagram showing a configuration example of the word driver 2 shown in FIG. 9.

In the second embodiment, in addition to the output of the temperature sensor circuit 6, a signal obtained by the cutting/non-cutting of a fuse (FUSE) 7 is inputted to the word drivers 2.

A signal TCNT<0> is the output signal of the temperature sensor circuit 6, and a signal TCNT<1> is the cut signal of the fuse 7. These signals TCNT<0> and TCNT<1> are sent to the word driver 2 and inputted to the respective gates of n-type MOS transistors Mn2 and Mn3 coupled to the word line WL. For example, during a wafer test, the threshold voltage Vth of an access MOS transistor (Access MOS) is evaluated in each chip by a monitor circuit provided inside the chip. If the threshold voltage Vth is lower than a reference value, the fuse 7 is cut so that the signal TCNT<1> is fixed to the high level.

This makes it possible to improve the SNM of a chip in which the voltage Vth has varied to a lower voltage in the wafer and improve the SRAM yield of the wafer. Since this can be performed independently of the compensation of the temperature characteristic performed by the temperature sensor circuit, it is possible to ensure the yield over a wide Vth range in combination with the yield improvement described in the first embodiment.

In the configuration of FIG. 9, the output signal TCNT of the temperature sensor circuit 6 is synchronized with a clock CK by a flip-flop in the SRAM module 10. The variation of the signal TCNT caused by temperature variation is asynchronous to the clock. Therefore, if the signal TCNT is inputted to the word driver 2 as it is, the high level on the word line WL may vary during the high level, which may make difficult the circuit design and tester evaluation. By synchronizing the signal TCNT with the clock CK, it is possible to treat the signal TCNT in the same way as the address selection signals AX and AY and the like.

Third Embodiment

Figure 11:
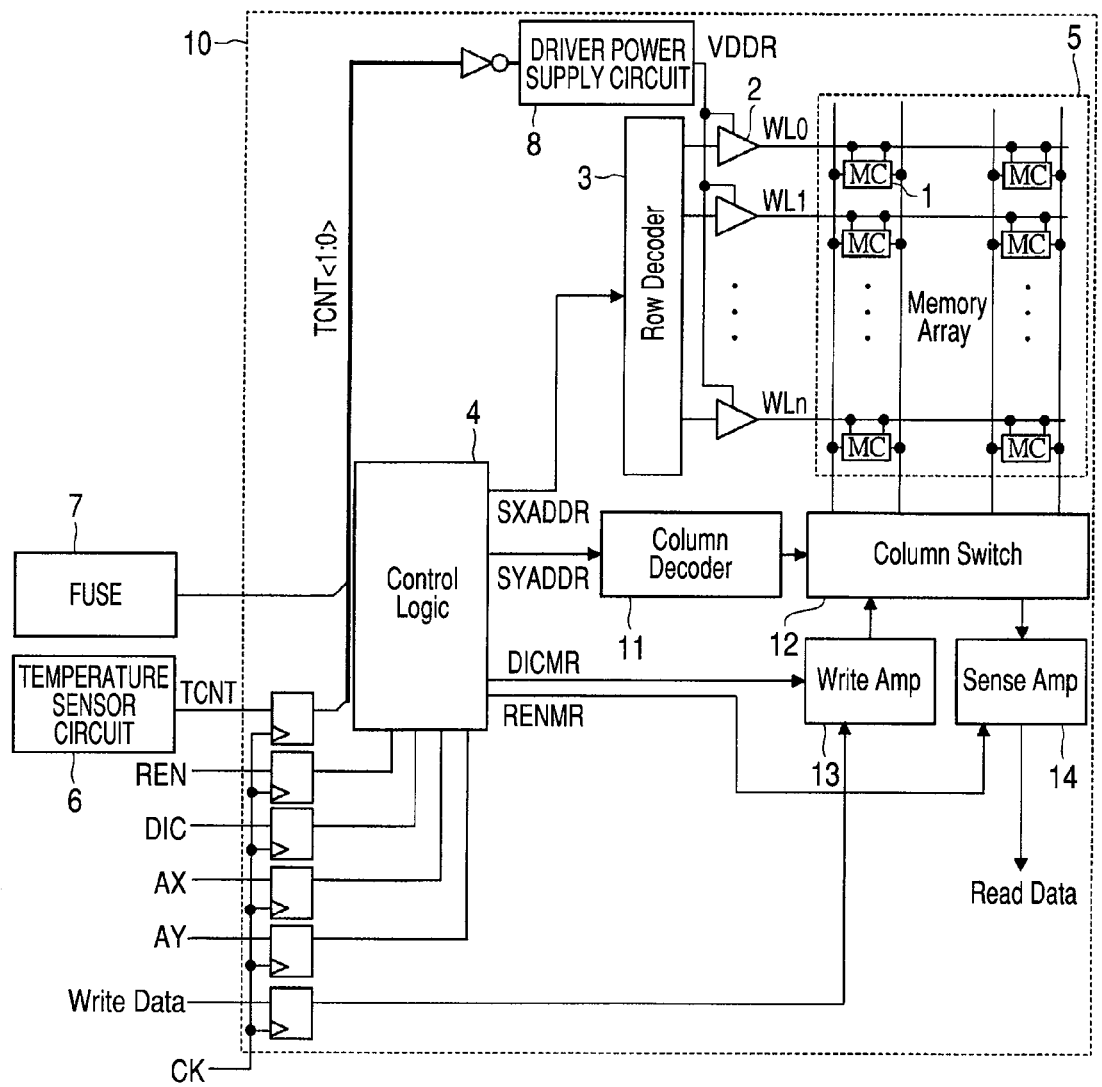
FIG. 11 is a block diagram showing a configuration example of an SRAM module in a semiconductor device according to a third embodiment of the invention.
Figure 12:
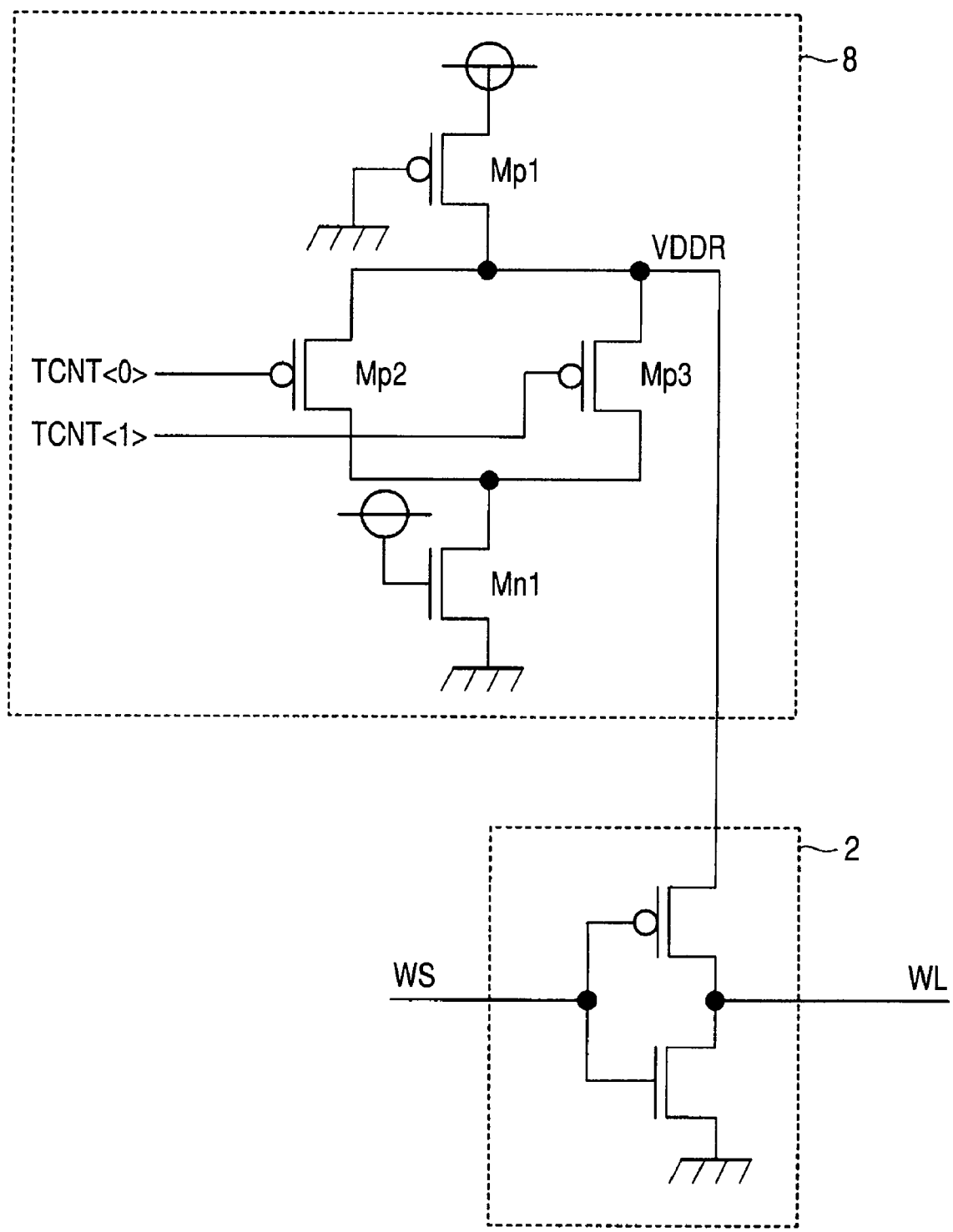
FIG. 12 is a circuit diagram showing a configuration example of the word driver and a driver power supply circuit shown in FIG. 11.

FIG. 11 is a block diagram showing a configuration example of an SRAM module in a semiconductor device according to the third embodiment of the invention. FIG. 12 is a circuit diagram showing a configuration example of the word driver 2 and a driver power supply circuit 8 shown in FIG. 11.

In the configuration example of FIG. 11, a signal TCNT<1:0> is inputted to the driver power supply circuit 8, which supplies a power supply voltage VDDR to the word drivers 2. The voltage level of the power supply voltage VDDR outputted from the driver power supply circuit 8 is determined based on current pull by a p-type MOS transistor Mp1 and p-type MOS transistor Mp2 and Mp3 selected by the signal TCNT<1:0>. Since the high level on the word line WL is the power supply voltage VDDR for the word drivers 2, the high level on the word line WL can be varied by the output of the temperature sensor circuit 6 and the cut signal of the fuse (FUSE) 7, as in the configuration example of FIG. 9 in the second embodiment.

Fourth Embodiment

Figure 13:
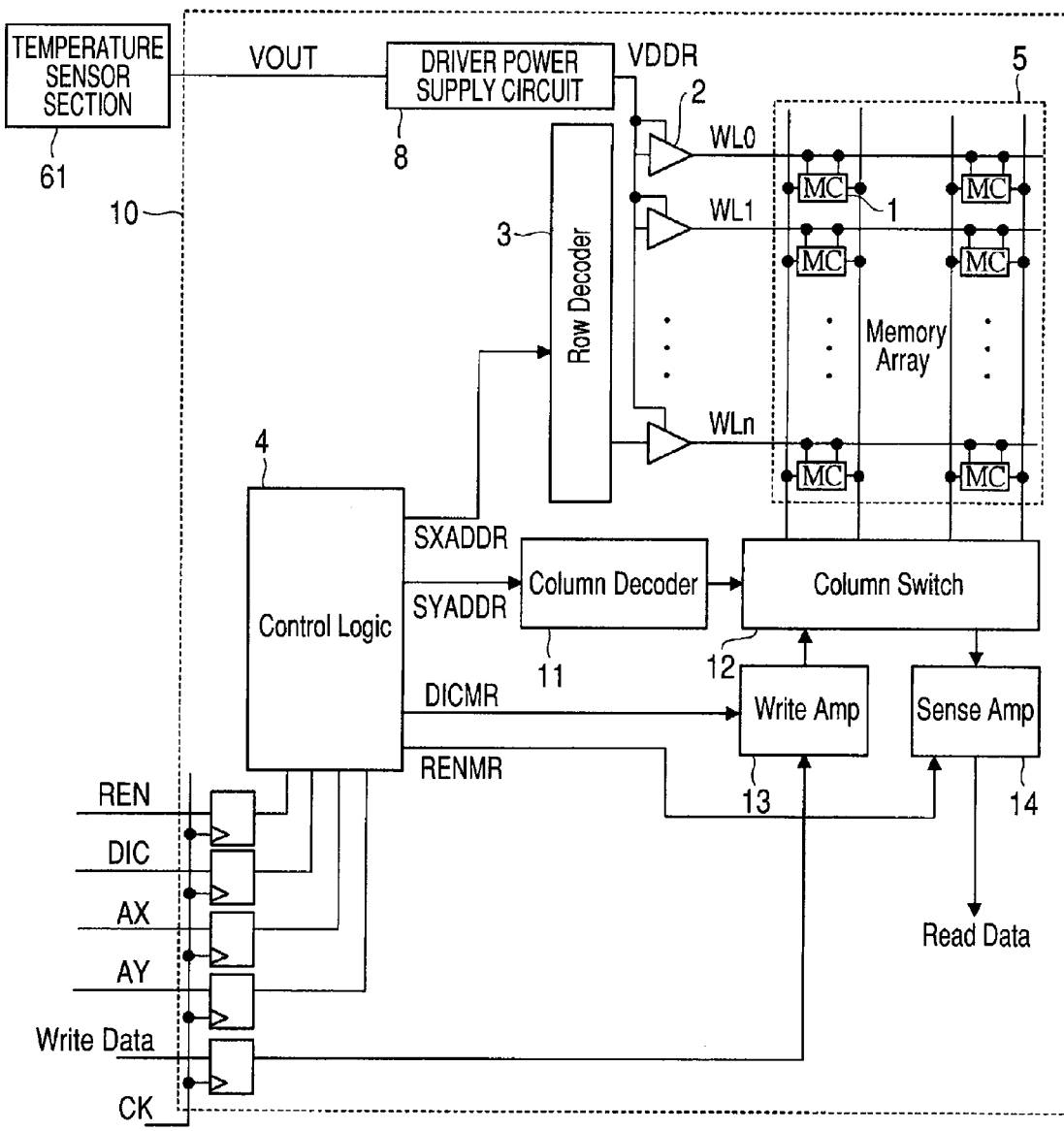
FIG. 13 is a block diagram showing a configuration example of an SRAM module in a semiconductor device according to a fourth embodiment of the invention.
Figure 14:
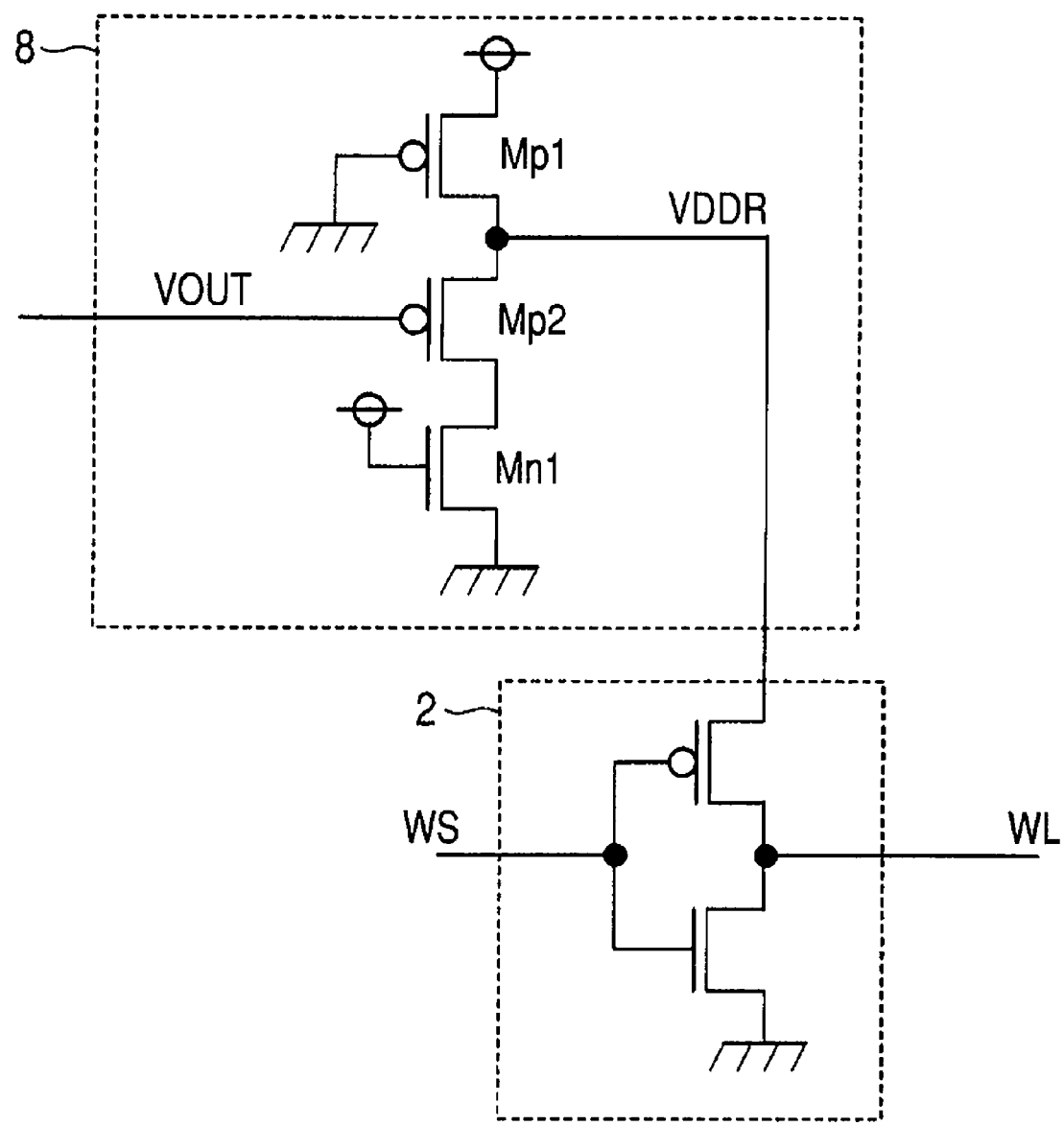
FIG. 14 is a circuit diagram showing a configuration example of the word driver and the driver power supply circuit shown in FIG. 13.
Figure 15:
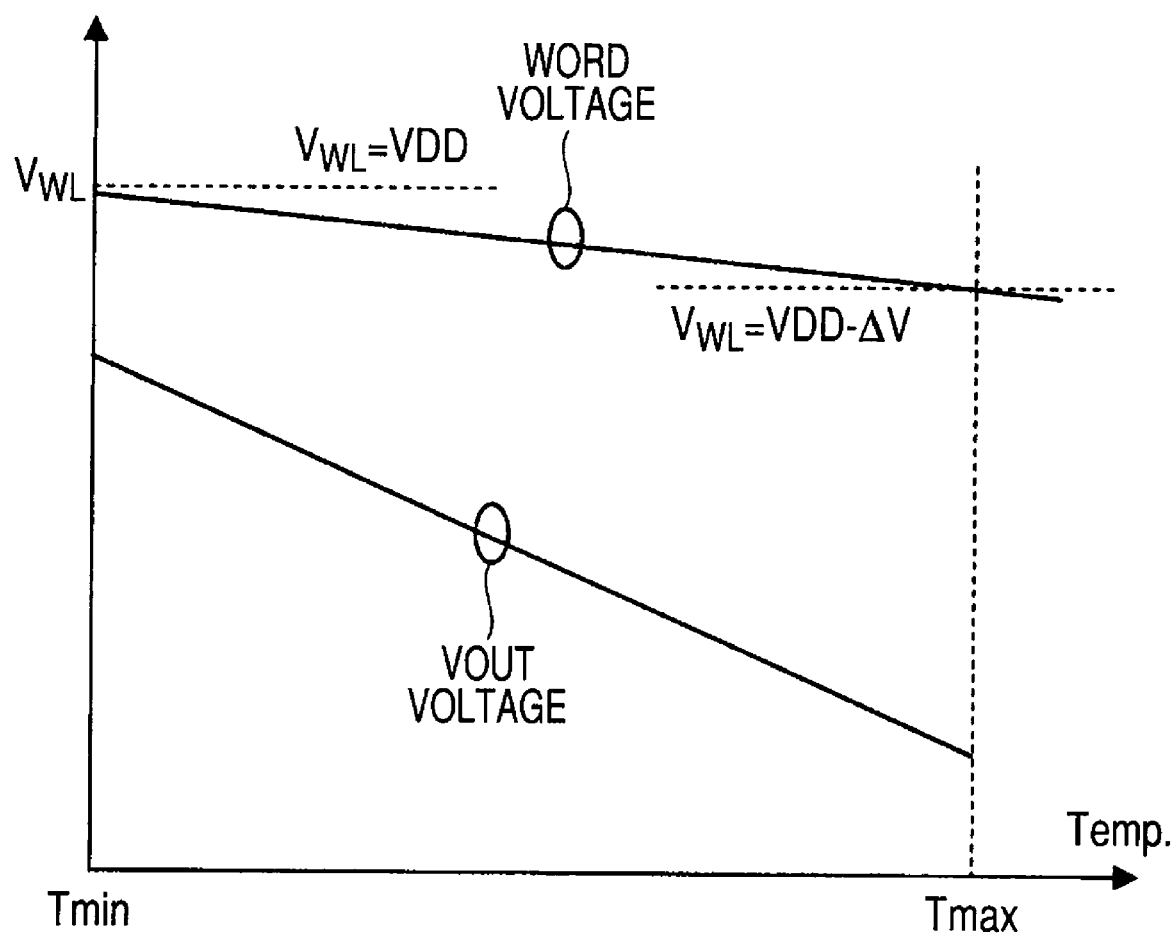
FIG. 15 is a graph showing the temperature characteristics of an output voltage VOUT of a temperature sensor section and the high level voltage $V_{WL}$ on the word line WL in the semiconductor device according to the fourth embodiment of the invention.

FIG. 13 is a block diagram showing a configuration example of an SRAM module in a semiconductor device according to the fourth embodiment of the invention. FIG. 14 is a circuit diagram showing a configuration example of the word driver 2 and the driver power supply circuit 8 shown in FIG. 13. FIG. 15 is a graph showing the temperature characteristics of the output voltage VOUT of the temperature sensor section 61 and the high level voltage $V_{WL}$ on the word line WL.

In the configuration example of FIG. 13, instead of the CMOS-level output signal TCNT of the temperature sensor circuit 6, the analog-level output voltage VOUT of the temperature sensor section 61 is directly inputted to the driver power supply circuit 8. The temperature sensor section 61 is the first half stage of the temperature sensor circuit 6 shown in FIG. 4, and has such a temperature characteristic that the output voltage VOUT becomes higher at lower temperatures and becomes lower at higher temperatures as shown in FIG. 15. The output voltage VOUT is inputted to the gate of a p-type MOS transistor Mp2 in the word driver 2 shown in FIG. 14. Since the output voltage VOUT becomes lower at higher temperatures, the current driving force of the p-type MOS transistor Mp2 increases, which can decrease the level of the power supply voltage VDDR determined based on current pull by the p-type MOS transistors Mp1 and Mp2. In the case where one temperature sensor section can be equipped for one memory cell array, it is possible to obtain more accurate temperature compensation than in the configuration example of FIG. 1.

Fifth Embodiment

Figure 16:
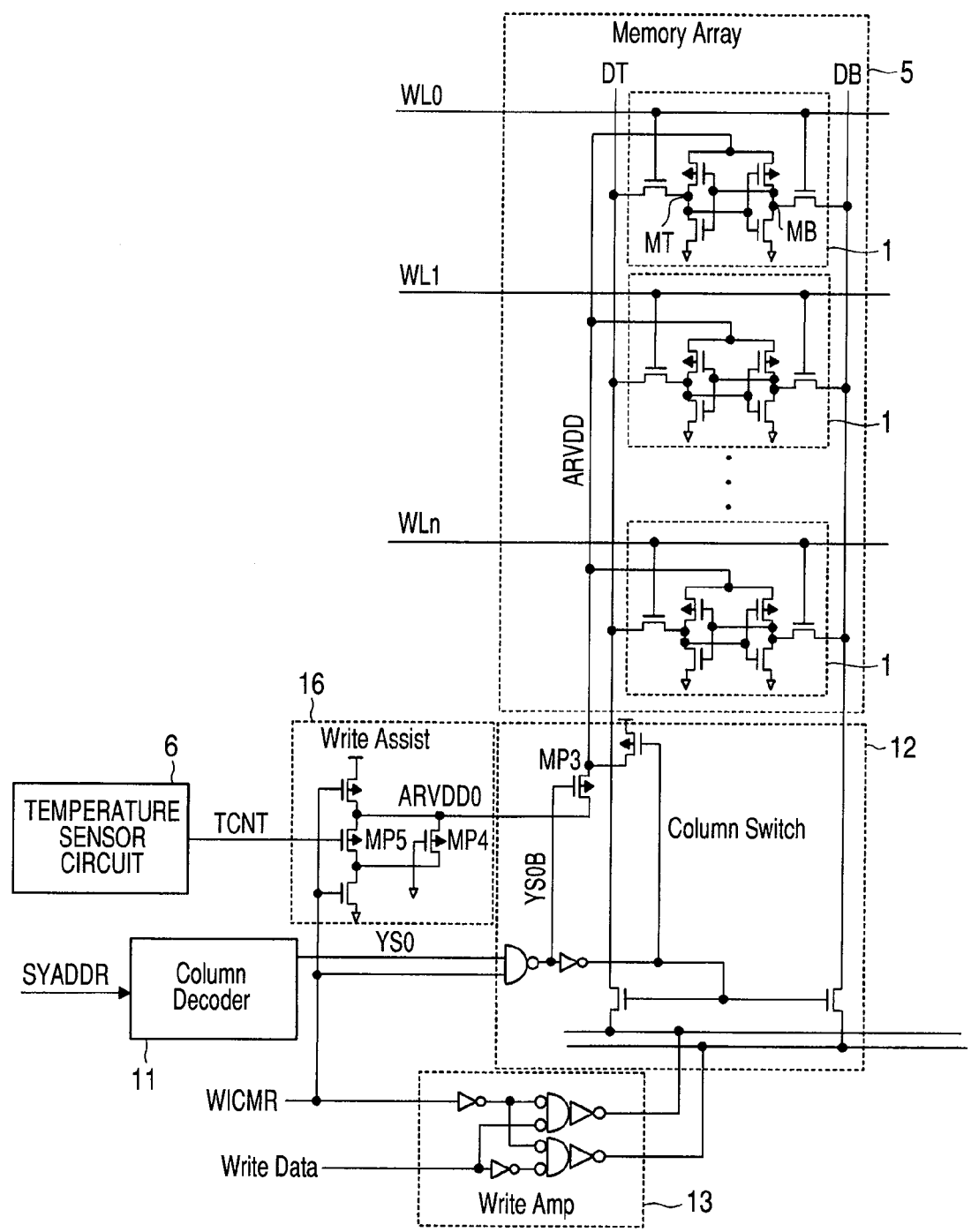
FIG. 16 is a block diagram showing a configuration example of an SRAM module in a semiconductor device according to a fifth embodiment of the invention.
Figure 17:
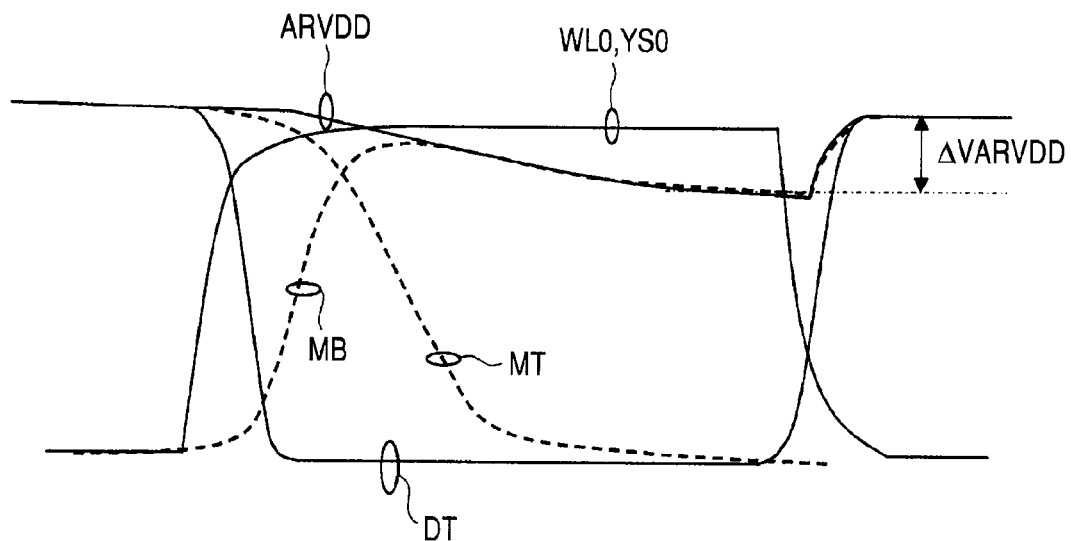
FIG. 17 is a waveform diagram showing a write operation to a memory cell using a write assist circuit in the semiconductor device according to the fifth embodiment of the invention.
Figure 18:
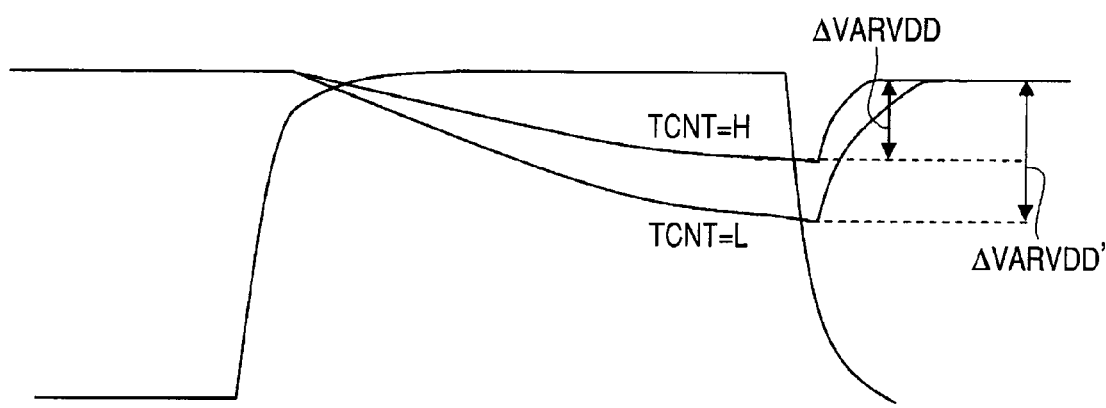
FIG. 18 is an enlarged diagram of FIG. 17.

FIG. 16 is a block diagram showing a configuration example of an SRAM module in a semiconductor device according to the fifth embodiment of the invention. FIG. 17 is a waveform diagram showing a write operation to a memory cell using a write assist circuit. FIG. 18 is an enlarged diagram of FIG. 17.

FIG. 16 shows a configuration example in which the output of the temperature sensor circuit 6 is used for the adjustment of a write assist level of the memory cell array (Memory Array) 5. FIG. 17 shows a write operation to a memory cell using a write assist circuit (Write Assist) 16.

A column selection signal YS0 obtained by decoding a Y address becomes the high level, and one (DT) of the selected bit line pair in the memory cell array is brought to the low level through the column switch 12 by the write amplifier 13. At the same time, a word line signal WL0 obtained by decoding an X address becomes the high level, which inverts the internal node of the selected memory cell 1. At this time, the source voltage ARVDD of the p-type MOS transistor of the memory cell 1 is decreased to VDD-ΔVARVDD by the write assist circuit 16. In the write assist circuit 16, at the same time as the column selection signal YS0, a write enable signal WICMR becomes the high level, which decreases ARVDD0 to turn on a p-type MOS transistor MP3, thereby decreasing ARVDD. At this time, ARVDD is not decreased to 0V but is decreased to a level determined by the threshold voltage Vth of the p-type MOS transistors MP3 and MP4 in the write assist circuit 16.

The decrease in ARVDD during the write operation decreases the on-state current of the p-type MOS transistor of the memory cell 1; accordingly, it is possible to perform stable writing to the memory cell 1 even if the threshold voltage Vth of the n-type MOS transistor is high. However, a large decrease in ARVDD causes an adverse effect. Since ARVDD is coupled to non-accessed memory cells other than the memory cell subjected to the write operation, a large decrease in ARVDD causes memory cell data corruption called a data retention failure.

The voltage ARVDD of the lower limit below which such a data retention failure occurs becomes higher at higher temperatures. Accordingly, by making ΔVARVDD large at the low temperatures of small write margins and making ΔVARVDD small at the high temperatures of small retention failure margins, the write margin and the data retention margin are compatible with each other. To achieve this, the threshold voltage Vth of a p-type MOS transistor MP5 is made low, the threshold voltage Vth of the p-type MOS transistor MP4 is made high, and the temperature sensor circuit 6 in which TCNT=L at the low temperatures is coupled to the gate of the p-type MOS transistor MP5. Since ARVDD is determined by the threshold voltage Vth of the p-type MOS transistor MP5 at the low temperatures and determined by the threshold voltage Vth of the p-type MOS transistor MP4 at the high temperatures, it is possible to make ΔVARVDD large at the low temperatures and make ΔVARVDD small at the high temperatures as described above.

Sixth Embodiment

Figure 19:
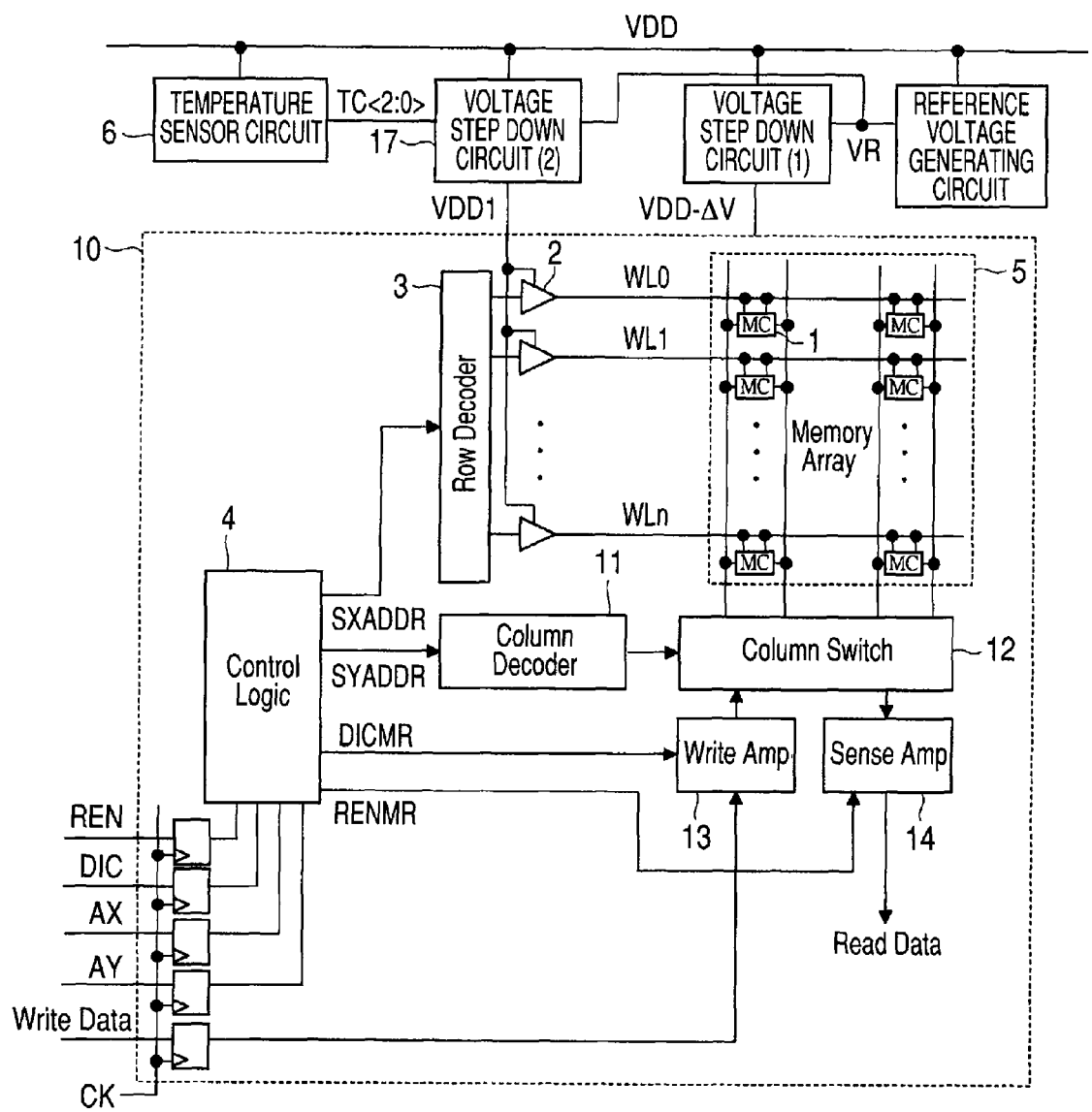
FIG. 19 is a block diagram showing a configuration example of an SRAM module in a semiconductor device according to a sixth embodiment of the invention.
Figure 20:
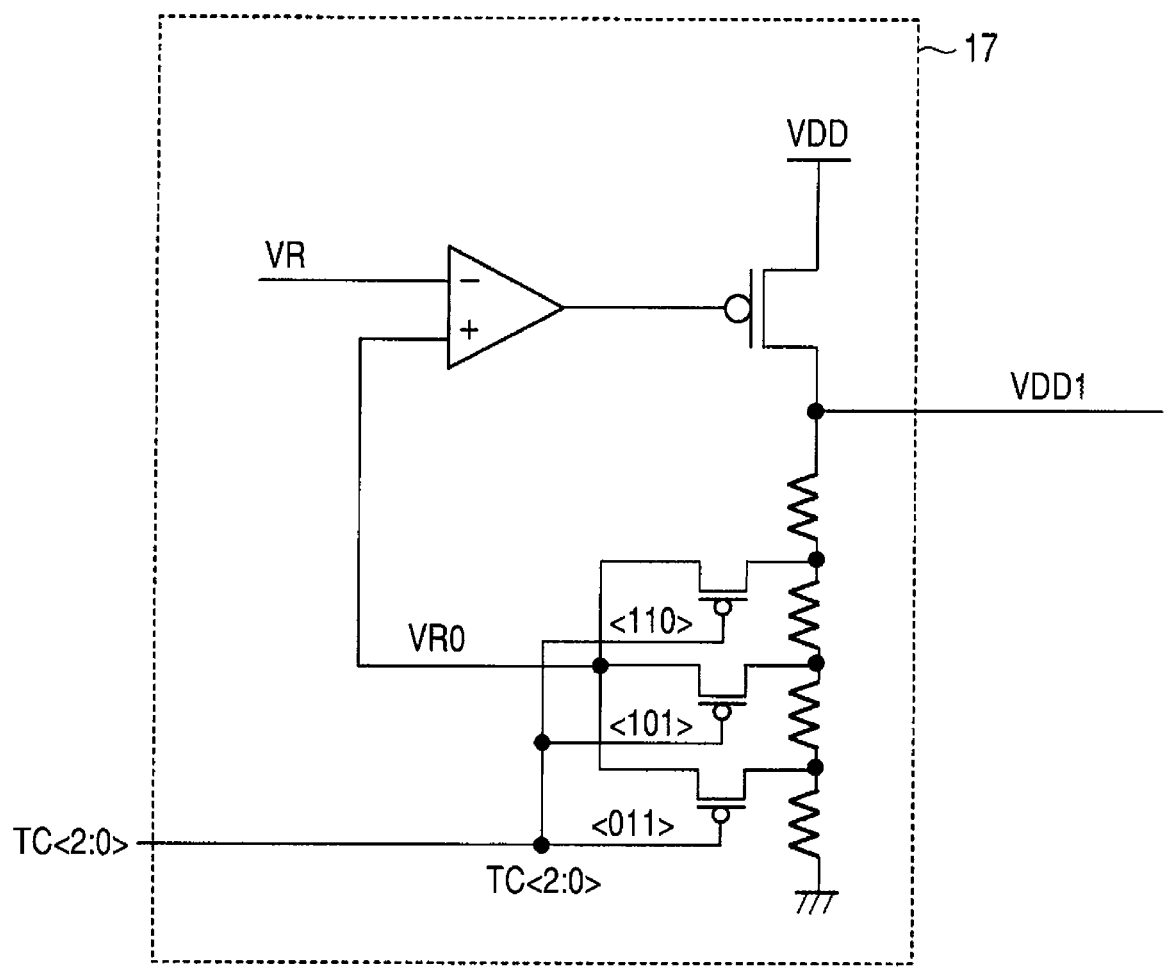
FIG. 20 is a circuit diagram showing a configuration example of a voltage step down circuit (2) shown in FIG. 19.
Figure 21:
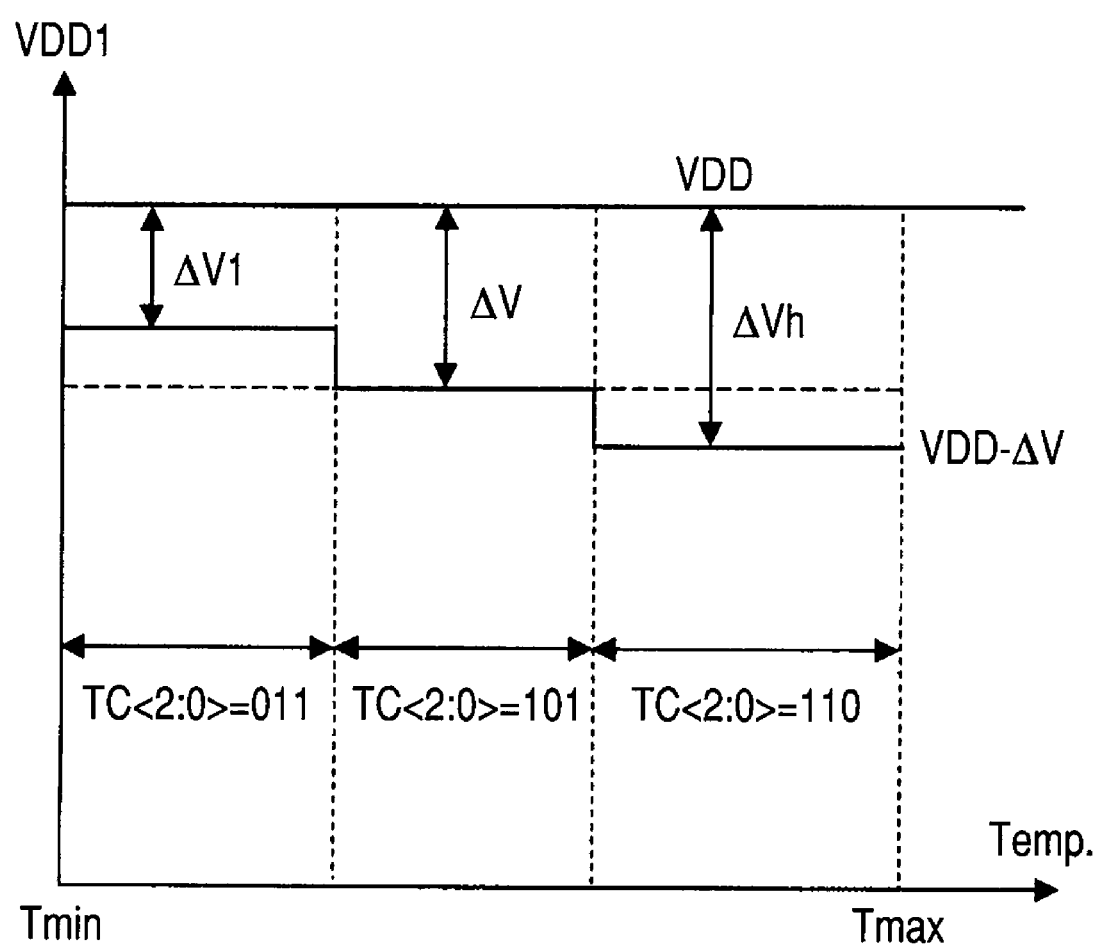
FIG. 21 is a graph showing the temperature characteristic of an output voltage VDD1 of the voltage step down circuit (2) in the semiconductor device according to the sixth embodiment of the invention.

FIG. 19 is a block diagram showing a configuration example of an SRAM module in a semiconductor device according to the sixth embodiment of the invention. FIG. 20 is a circuit diagram showing a configuration example of a voltage step down circuit (2) 17 shown in FIG. 19. FIG. 21 is a graph showing the temperature characteristic of an output voltage VDD1 of the voltage step down circuit (2) 17.

FIG. 19 shows another configuration example in which a word line voltage is varied by the temperature sensor circuit 6. In this configuration example, the power supply voltage VDD supplied to the semiconductor device is stepped down by a voltage step down circuit (1) to a voltage (VDD-ΔV), which is supplied as a power supply voltage to the gates including the memory cell array, while a voltage VDD1 stepped down by the voltage step down circuit (2) 17 controlled by the temperature sensor circuit 6 is supplied as a power supply voltage to the word drivers 2.

The output TC of the temperature sensor circuit 6 is a 3-bit signal which changes among the three steps of <011>, <101>, and <110> in the semiconductor device compensation temperatures between Tmin and Tmax as shown in FIG. 21. In the voltage step down circuit (2) 17 shown in FIG. 20, a voltage VR0 obtained by resistance-dividing the voltage VDD1 and fed back to a differential amplifier is changed by the output TC. Since the differential amplifier adjusts the output voltage VDD1 so that the voltage VR0 becomes equal to the voltage VR, the voltage VDD1 becomes higher if the output TC is <011> and becomes lower if the output TC is <110>.

On the other hand, the configuration of the voltage step down circuit (1) is the same as in FIG. 20, and <101> is always selected. Consequently, the high level (=VDD1) on the word line WL of the word driver 2 becomes higher than the voltage (VDD-ΔV) at low temperatures, and becomes lower than the voltage (VDD-ΔV) at high temperatures. Unlike the configuration example of FIG. 11 according to the third embodiment, the word line voltage can be higher as well as lower than that of the memory cell array, which makes it possible to perform design with a wider operation margin.

Seventh Embodiment

Figure 22:
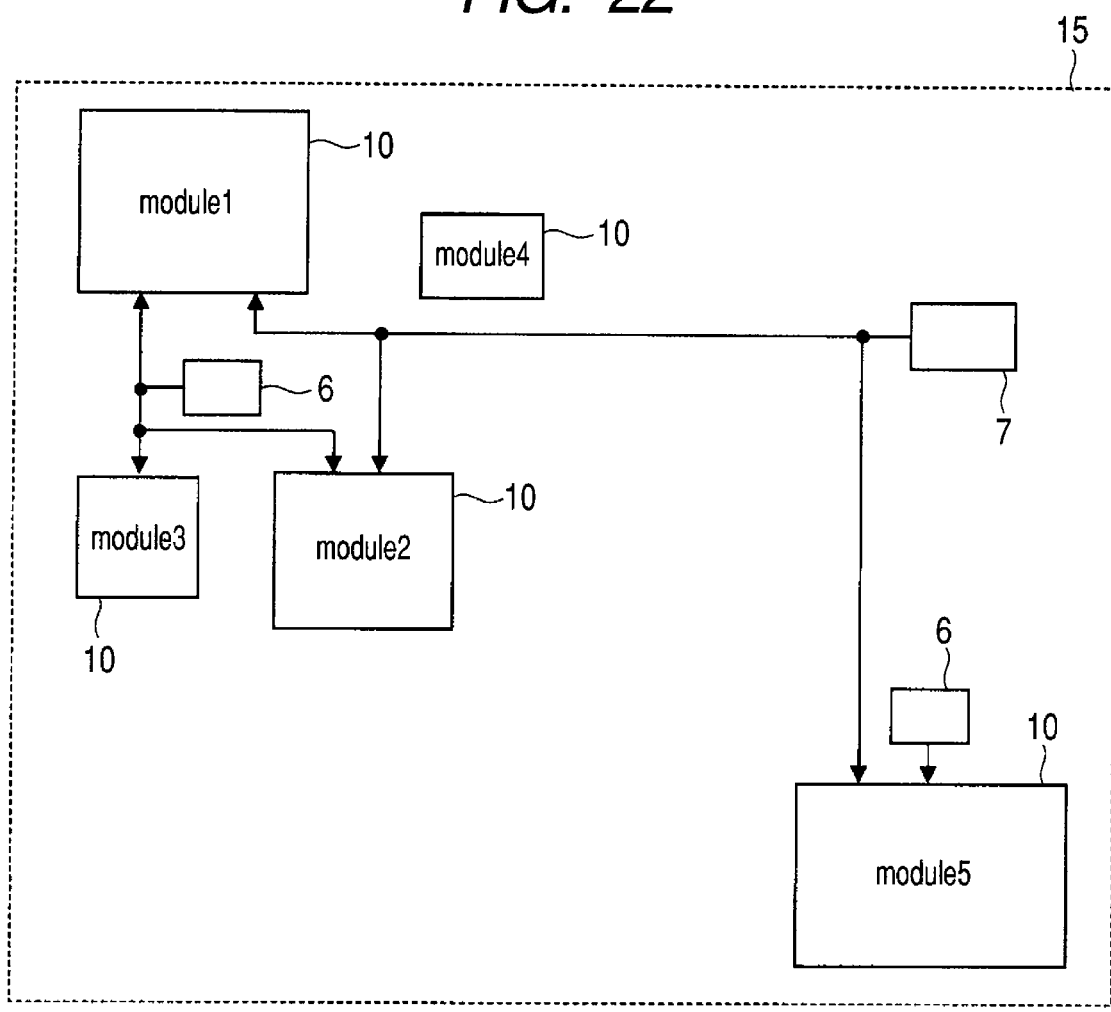
FIG. 22 is a block diagram showing a configuration example of an SOC including a plurality of SRAM modules in a semiconductor device according to a seventh embodiment of the invention.
Figure 23:
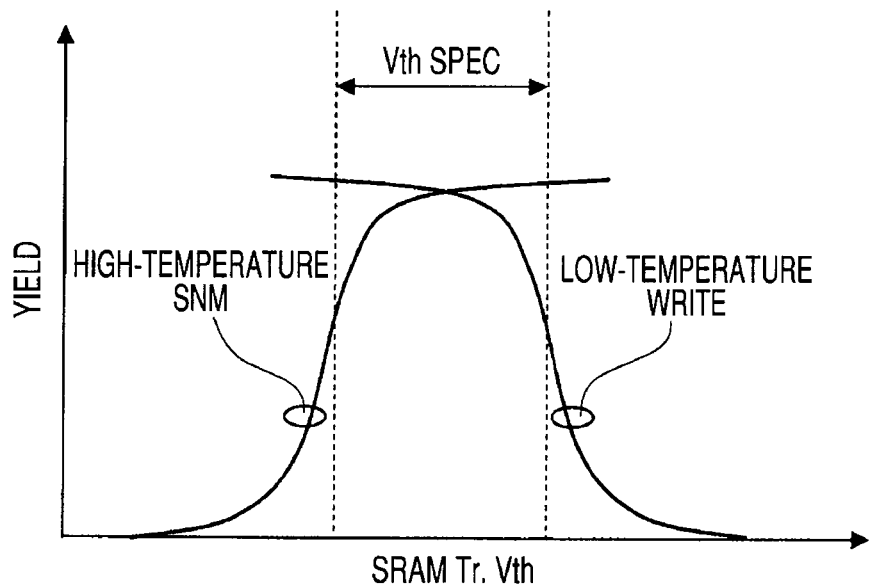
FIG. 23 is a graph showing the relationship between an SNM and a write margin, investigated as a premise of the invention.
Figure 24:
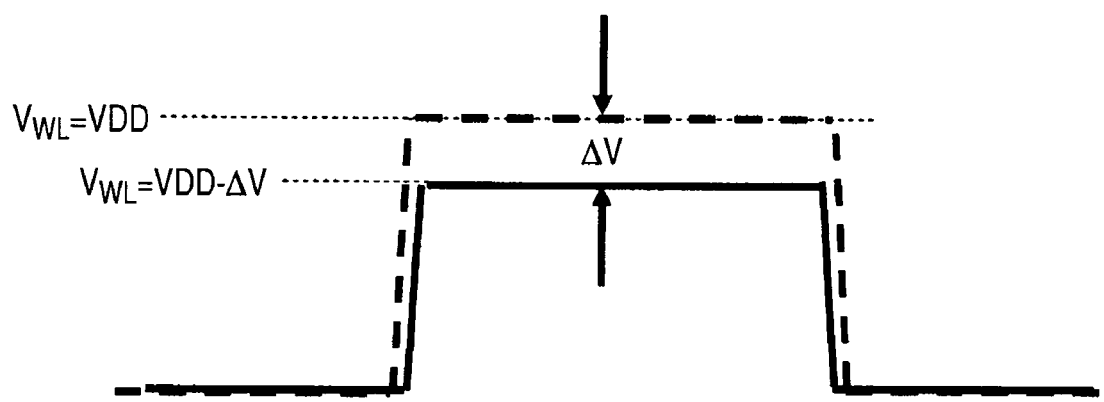
FIG. 24 is a diagram showing the waveform of the high level voltage on the word line, investigated as a premise of the invention.
Figure 25:
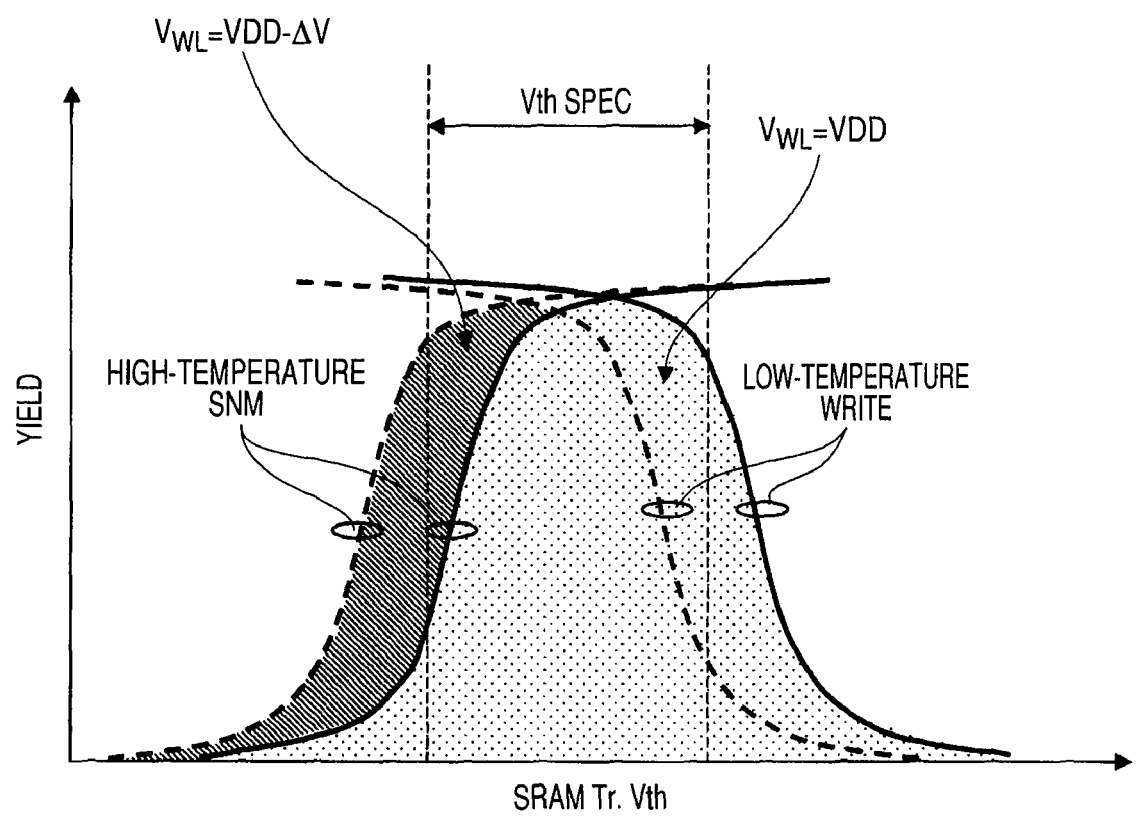
FIG. 25 shows the relationship between the SNM and the write margin in the case where the high level voltage on the word line is ΔV lower than a power supply voltage VDD, investigated as a premise of the invention.

FIG. 22 is a block diagram showing a configuration example of an SOC including a plurality of SRAM modules in a semiconductor device according to the seventh embodiment of the invention.

FIG. 22 shows a configuration example in which the invention is applied to an SOC (System On a Chip) 15. Typically, an SOC contains a plurality of memory modules having different capacities in the chip. The SOC 15 according to the seventh embodiment contains a plurality of SRAM modules 10, each of which is described in the first to sixth embodiments. In FIG. 22, a module 1, a module 2, and a module 5 are large-capacity SRAM modules, a module 3 is an intermediate-capacity SRAM module, and a module 4 is a small-capacity SRAM module. These SRAM modules are a kind of memory module. The memory module refers to one that has a memory cell array including a plurality of memory cells, a sense amplifier, drivers, decoders, and other peripheral circuits, and functions independently as a memory.

Since the possibility of the existence of an SRAM memory cell having a large variation in the threshold voltage Vth increases with increasing memory capacity, the large-capacity modules require the combined use of the temperature sensor circuit 6 and the cutting of the fuse 7 in accordance with the evaluation of Vth to ensure the yield. On the other hand, the intermediate-capacity module 3 requires only the temperature sensor circuit 6 to ensure the yield, and the small-capacity module 4 does not require the fuse or the temperature sensor circuit. Thus, it is possible to use the temperature sensor circuit 6 and the fuse 7 appropriately for each memory capacity, which can facilitate memory module design.

Further, the module 5 is disposed away from the other modules in the chip. Since the temperature distribution of the chip may be uneven especially in a product of a large die size, the memory module (module 5) uses the output of an adjacent temperature sensor circuit 6 among a plurality of temperature sensor circuits 6 provided in the chip.

While the invention made above by the present inventors has been described specifically based on the illustrated embodiments, the present invention is not limited thereto. It is needless to say that various changes and modifications can be made thereto without departing from the spirit and scope of the invention.

Accordingly, some or all of the embodiments may be combined as appropriate.

The invention is effective for a synchronous type semiconductor memory having SRAM memory, and is particularly effective for an elementary SRAM product, an elementary SOC product, and the like.

What is claimed is:

1. A semiconductor device having a plurality of static memory cells whose read margin is lower at high temperature and write margin is lower at low temperature, comprising:
    a memory cell array having the static memory cells arranged in a matrix;
    a temperature sensor circuit for sensing a temperature in the semiconductor device; and
    a voltage control circuit for controlling a voltage supplied to a selection word line of the memory cell array based on an output of the temperature sensor circuit at the time of writing to or reading from a static memory cell,
    wherein the voltage control circuit sets the voltage on the selection word line to a first voltage if a temperature in the semiconductor device is lower than a first temperature so that the write margin is kept at a low temperature value, and sets the voltage on the selection word line to a second voltage lower than the first voltage if the temperature in the semiconductor device is higher than the first temperature so that the read margin is kept at a high temperature value.

2. The semiconductor device according to claim 1,
    wherein the temperature sensor circuit includes a Schmitt trigger circuit having a hysteresis characteristic.

3. The semiconductor device according to claim 1,
    wherein the semiconductor device includes a plurality of memory modules, each of the memory modules includes the memory cell array and the voltage control circuit, and
    wherein the output of the temperature sensor circuit is inputted in common to the memory modules.

4. The semiconductor device according to claim 3, further comprising a fuse,
    wherein the voltage control circuit controls a voltage supplied to the memory cell array based on the fuse and the output of the temperature sensor circuit.

5. The semiconductor device according to claim 4, further comprising:
    a second memory module which has a larger memory capacity than each of the memory modules; and
    a second temperature sensor circuit,
    wherein an output of the second temperature sensor circuit is inputted to a voltage control circuit in the second memory module.

6. A semiconductor device having a plurality of static memory cells, comprising:
    a memory cell array having the static memory cells arranged in a matrix;
    a temperature sensor circuit for sensing a temperature in the semiconductor device; and
    a voltage control circuit for controlling a voltage supplied to the memory cell array based on an output of the temperature sensor circuit at the time of writing to or reading from a static memory cell,
    wherein the voltage controlled by the voltage control circuit is a voltage that is supplied to a source of a p-type MOS transistor configuring the static memory cell at the time of writing to the static memory cell.

7. The semiconductor device according to claim 6,
    wherein the voltage control circuit sets the voltage supplied to the source of the p-type MOS transistor to a first voltage if a temperature in the semiconductor device is higher than a first temperature, and sets the voltage supplied to the source of the p-type MOS transistor to a second voltage lower than the first voltage if the temperature in the semiconductor device is lower than the first temperature.

* * * * *